(12) United States Patent
Yoon et al.

(10) Patent No.: US 11,955,429 B2
(45) Date of Patent: Apr. 9, 2024

(54) THREE-DIMENSIONAL MEMORY DEVICE AND MANUFACTURING METHOD THEREOF

(71) Applicant: SK hynix Inc., Icheon-si (KR)

(72) Inventors: Chan Ho Yoon, Icheon-si (KR); Jin Ho Kim, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 18/328,416

(22) Filed: Jun. 2, 2023

(65) Prior Publication Data

US 2023/0317609 A1    Oct. 5, 2023

Related U.S. Application Data

(62) Division of application No. 17/225,517, filed on Apr. 8, 2021, now Pat. No. 11,705,397.

(30) Foreign Application Priority Data

Nov. 26, 2020 (KR) ........................ 10-2020-0161361

(51) Int. Cl.
*H01L 21/768* (2006.01)
*H01L 23/522* (2006.01)
*H01L 23/528* (2006.01)
*H10B 41/27* (2023.01)
*H10B 41/41* (2023.01)
*H10B 43/27* (2023.01)
*H10B 43/40* (2023.01)

(52) U.S. Cl.
CPC .... *H01L 23/5283* (2013.01); *H01L 21/76816* (2013.01); *H01L 21/76877* (2013.01); *H01L 23/5226* (2013.01); *H10B 41/27* (2023.02); *H10B 41/41* (2023.02); *H10B 43/27* (2023.02); *H10B 43/40* (2023.02)

(58) Field of Classification Search
None
See application file for complete search history.

(56) References Cited

U.S. PATENT DOCUMENTS

| | | | |
|---|---|---|---|
| 2013/0020647 A1* | 1/2013 | Hwang | H10B 43/10 257/E29.264 |
| 2020/0105783 A1 | 4/2020 | Baek | |
| 2020/0365616 A1 | 11/2020 | Baek | |
| 2022/0093635 A1 | 3/2022 | Lee | |

FOREIGN PATENT DOCUMENTS

KR    10-2021-0145417 A    12/2021

* cited by examiner

*Primary Examiner* — Hsien Ming Lee

(57) ABSTRACT

A method for manufacturing a three-dimensional memory device, comprises: forming, on a substrate, a sacrificial layer including a plurality of sacrificial patterns for vias and a sacrificial pattern for a row line; forming an interlayer dielectric layer that covers the sacrificial pattern for a row line and the sacrificial pattern for a via coupled to the sacrificial pattern for a row line and that has a plurality of holes exposing sacrificial patterns for vias, from among the plurality of sacrificial patterns for vias, that are not coupled to the sacrificial pattern for a row line; forming a plurality of first conductive patterns in the plurality of holes; repeating the forming of the sacrificial layer; and replacing the plurality of sacrificial layers with a conductive material.

3 Claims, 47 Drawing Sheets

THREE-DIMENSIONAL MEMORY DEVICE AND MANUFACTURING METHOD THEREOF

CROSS-REFERENCE TO RELATED APPLICATION

The present application is a divisional application of a U.S. patent application Ser. No. 17/225,517, filed on Apr. 8, 2021, which claims priority under 35 U.S.C. § 119(a) to Korean Patent Application No. 10-2020-0161361 filed in the Korean Intellectual Property Office on Nov. 26, 2020, which is incorporated herein by reference in its entirety.

BACKGROUND

1. Technical Field

Various embodiments generally relate to a semiconductor technology, and particularly, to a three-dimensional memory device and a manufacturing method thereof.

2. Related Art

A three-dimensional memory device has advantages in that a larger capacity may be realized within the same area by increasing the number of stacks through stacking memory cells in a vertical direction, thereby providing high performance and excellent power efficiency.

In the three-dimensional memory device, the degree of integration may be increased by increasing the number of row lines (specifically, word lines) to be stacked. However, if the number of row lines is increased, the number of wiring lines used to couple the row lines and a peripheral circuit (specifically, a row decoder) increases, and thus, the degree of integration may decrease. Therefore, an efficient wiring line layout method is required.

SUMMARY

Various embodiments are directed to a three-dimensional memory device that improves the degree of integration and a manufacturing method thereof.

In an embodiment, a three-dimensional memory device may include: a plurality of row lines stacked alternately with a plurality of interlayer dielectric layers in a vertical direction on a substrate, and each of the plurality of row lines having a projection from a side surface thereof; and a plurality of vias extending in the vertical direction from the substrate, each coupled to the projection of a corresponding row line, and electrically coupling the plurality of row lines to a peripheral circuit defined below the substrate.

In an embodiment, a method for manufacturing a three-dimensional memory device may include: forming, on a substrate, a sacrificial layer including a plurality of sacrificial patterns for vias and a sacrificial pattern for a row line, which has a projection coupled to a corresponding sacrificial pattern for a via from among the plurality of sacrificial patterns for vias; forming an interlayer dielectric layer that covers the sacrificial pattern for a row line and the sacrificial pattern for a via coupled to the sacrificial pattern for a row line and that has a plurality of holes exposing sacrificial patterns for vias, from among the plurality of sacrificial patterns for vias, that are not coupled to the sacrificial pattern for a row line; forming a plurality of first conductive patterns in the plurality of holes; repeating the forming of the sacrificial layer, the forming of the interlayer dielectric layer and the forming of the plurality of first conductive patterns to stack a plurality of sacrificial layers, a plurality of interlayer dielectric layers and a plurality of first conductive patterns on the substrate; and replacing the plurality of sacrificial layers with a conductive material.

In an embodiment, a three-dimensional memory device may include: a plurality of row lines stacked alternately with a plurality of interlayer dielectric layers in a vertical direction on a substrate; a plurality of coupling lines directly coupled onto the plurality of row lines and having projections projecting beyond side surfaces of the plurality of row lines, respectively; and a plurality of vias extending in the vertical direction from the substrate and coupled to the projections, respectively, of the plurality of coupling lines and electrically coupling the plurality of row lines and a peripheral circuit defined below the substrate.

In an embodiment, a method for manufacturing a three-dimensional memory device may include: forming, on a substrate, a sacrificial layer including a sacrificial pattern for a row line and a plurality of sacrificial patterns for vias; forming an interlayer dielectric layer that covers the sacrificial pattern for a row line and that has a plurality of holes exposing the plurality of sacrificial patterns for vias; stacking a plurality of sacrificial layers and a plurality of interlayer dielectric layers on the substrate by alternately repeating the forming of the sacrificial layer and the forming of the interlayer dielectric layer; forming a staircase structure that exposes portions of each of the plurality of sacrificial layers; forming, on the staircase structure, a plurality of sacrificial patterns for coupling lines, which correspond respectively to the plurality of sacrificial layers, and each of the plurality of sacrificial patterns for coupling lines coupling a sacrificial pattern for a row line and at least one of the plurality of sacrificial patterns for vias of the corresponding sacrificial layer; and replacing the plurality of sacrificial layers and the plurality of sacrificial patterns for coupling lines with a conductive material.

In an embodiment, a method for manufacturing a three-dimensional memory device may include: forming a sacrificial layer on a substrate; forming, on the sacrificial layer, an interlayer dielectric layer that covers a portion of the sacrificial layer; stacking a plurality of sacrificial layers and a plurality of interlayer dielectric layers by alternately repeating the forming of the sacrificial layer and the forming of the interlayer dielectric layer; forming, in the vicinity of the plurality of interlayer dielectric layers, a plurality of supports that pass through the plurality of sacrificial layers; separating, by forming a slit in the plurality of sacrificial layers, a sacrificial pattern for a row line and a plurality of sacrificial patterns for vias in each of the sacrificial layers; forming a staircase structure that exposes portions of each of the plurality of sacrificial layers; forming, on the staircase structure, a plurality of sacrificial patterns for coupling lines, which correspond respectively to the plurality of sacrificial layers, and each of the plurality of sacrificial patterns for coupling lines coupling a sacrificial pattern for a row line and at least one of the plurality of sacrificial patterns for vias of the corresponding sacrificial layer; and replacing the plurality of sacrificial layers and the plurality of sacrificial patterns for coupling lines with a conductive material.

DETAILED DESCRIPTION

Figure 1:
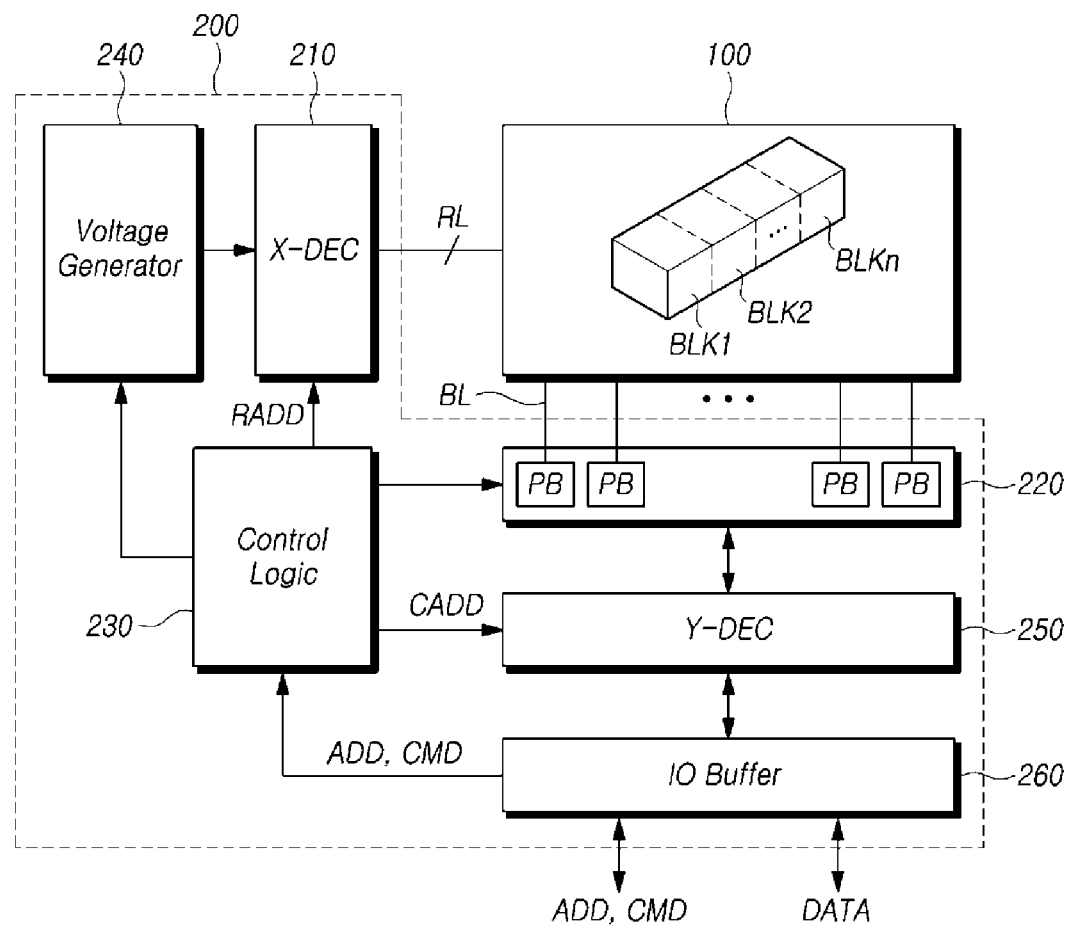
FIG. 1 is a block diagram schematically illustrating a three-dimensional memory device in accordance with an embodiment of the disclosure.

Advantages and features of the disclosure and methods to achieve them will become apparent from the descriptions of exemplary embodiments herein below and described with reference to the accompanying drawings. However, the present disclosure is not limited to the exemplary embodiments disclosed herein but may be implemented in various different ways. The exemplary embodiments of the present disclosure convey the scope of the disclosure to those skilled in the art.

Because the figures, dimensions, ratios, angles, numbers of elements given in the drawings that describe embodiments of the disclosure are merely illustrative, the present disclosure is not limited to the illustrated matters. Throughout the specification, like reference numerals refer to like components. In describing the disclosure, when it is determined that a detailed description of the related art may obscure the gist or clarity of the disclosure, the detailed description thereof will be omitted. It is to be understood that the terms "comprising," "having," "including" and so on, used in the description and claims, should not be interpreted as being restricted to the means listed thereafter unless specifically stated otherwise. Where an indefinite or definite article (e.g., "a," "an" or "the") is used when referring to a singular noun, the article may include a plural of that noun unless specifically stated otherwise.

In interpreting elements in embodiments of the disclosure, they should be interpreted as including error margins even in the absence of explicit statements.

Also, in describing the components of the disclosure, there may be used terms such as first, second, A, B, (a), and (b). These are solely for the purpose of differentiating one component from another component and do not limit the substances, order, sequence or number of the components. Also, components in embodiments of the disclosure are not limited by these terms. These terms are used to merely distinguish one component from another component. Accordingly, as used herein, a first component may be a second component within the technical spirit of the disclosure.

If a component is described as "connected," "coupled" or "linked" to another component, it may mean that the component is not only directly "connected," "coupled" or "linked" but also is indirectly "connected," "coupled" or "linked" via a third component. In describing positional relationship, such as "an element A on an element B," "an element A above an element B," "an element A below an element B" and "an element A next to an element B," one or more other elements may be disposed between the elements A and B unless the term "directly" or "immediately" is explicitly used.

Features of various exemplary embodiments of the disclosure may be coupled, combined or separated partially or totally. Technically various interactions and operations are possible. Various exemplary embodiments can be practiced individually or in combination.

Hereinafter, various examples of embodiments of the disclosure will be described in detail with reference to the accompanying drawings.

FIG. 1 is a block diagram schematically illustrating a three-dimensional memory device in accordance with an embodiment of the disclosure.

Referring to FIG. 1, a three-dimensional memory device in accordance with an embodiment of the disclosure may include a memory cell array 100 and a peripheral circuit 200. The peripheral circuit 200 may include a row decoder (X-DEC) 210, a page buffer circuit 220, a control logic 230, a voltage generator 240, a column decoder (Y-DEC) 250 and an input/output buffer (IO buffer) 260.

The memory cell array 100 may include a plurality of memory blocks BLK1 to BLKn. Each of the memory blocks BLK1 to BLKn may include a plurality of cell strings. Each of the cell strings may include a plurality of memory cells, which are stacked on a substrate. Although, in the present specification, a memory cell may be described as a flash memory cell in examples, the type of a memory cell is not limited thereto, and the technical spirit of the disclosure may be applied to other types of memory cells in addition to flash memory cells.

The memory cell array 100 may be coupled to the row decoder 210 through row lines RL. The row lines RL may include select lines and word lines, and the select lines may include a drain select line and a source select line. The memory cell array 100 may be coupled to the page buffer circuit 220 through bit lines BL. The row lines RL may be coupled to the respective memory blocks BLK1 to BLKn. The bit lines BL may be coupled in common to the plurality of memory blocks BLK1 to BLKn.

The row decoder 210 may select any one among the memory blocks BLK1 to BLKn of the memory cell array 100 in response to a row address RADD provided from the control logic 230. The row decoder 210 may transfer operating voltages from the voltage generator 240, for example, a program voltage (Vpgm), a pass voltage (Vpass) and a read voltage (Vread), to the row lines RL coupled to a selected memory block.

The page buffer circuit 220 may include a plurality of page buffers PB, which are coupled to the memory cell array 100 through the bit lines BL. The page buffers PB may operate as write drivers or sense amplifiers depending on an operation mode. In a program operation, the page buffers PB may latch data DATA received through the input/output buffer 260 and the column decoder 250, and may apply voltages, necessary for storing the data DATA in selected memory cells, to the bit lines BL in response to a control signal from the control logic 230. In a read operation, the page buffers PB may read data DATA, stored in selected memory cells, through the bit lines BL, and may output the read data DATA to an external element through the column decoder 250 and the input/output buffer 260.

The control logic 230 may output a row address RADD of an address ADD, received through the input/output buffer 260, to the row decoder 210, and may output a column address CADD of the address ADD, received through the input/output buffer 260, to the column decoder 250. The control logic 230 may control the page buffer circuit 220 and the voltage generator 240 to access selected memory cells, in response to a command CMD received through the input/output buffer 260.

The voltage generator 240 may generate various voltages required in the memory device. For example, the voltage generator 240 may generate a program voltage, a pass voltage, a select read voltage and an unselect read voltage. The column decoder 250 may input program data to the page buffer circuit 220 in response to the column address CADD from the control logic 230.

As the size of an electronic product in which a memory device is mounted decreases, reduction in the size of the memory device is continuously required. As the number of the row lines RL is increased due to a demand for high capacity, the number of wiring lines that couple the row lines RL and the row decoder 210 is being increased. In order to suppress an increase in the size of the memory device due to an increase in the number of wiring lines, and in order to increase the degree of integration, an efficient wiring line layout method is required.

Hereinbelow, in the accompanying drawings, a direction vertically projecting from the top surface of a substrate is defined as a vertical direction VD, and two directions parallel to the top surface of the substrate and intersecting with each other are defined as a first direction FD and a second direction SD, respectively. For example, the first direction FD may correspond to the extending direction of row lines, and the second direction SD may correspond to the extending direction of bit lines. The first direction FD and the second direction SD may substantially perpendicularly intersect with each other. In the drawings, a direction indicated by an arrow and a direction opposite thereto represent the same direction.

Figure 2:
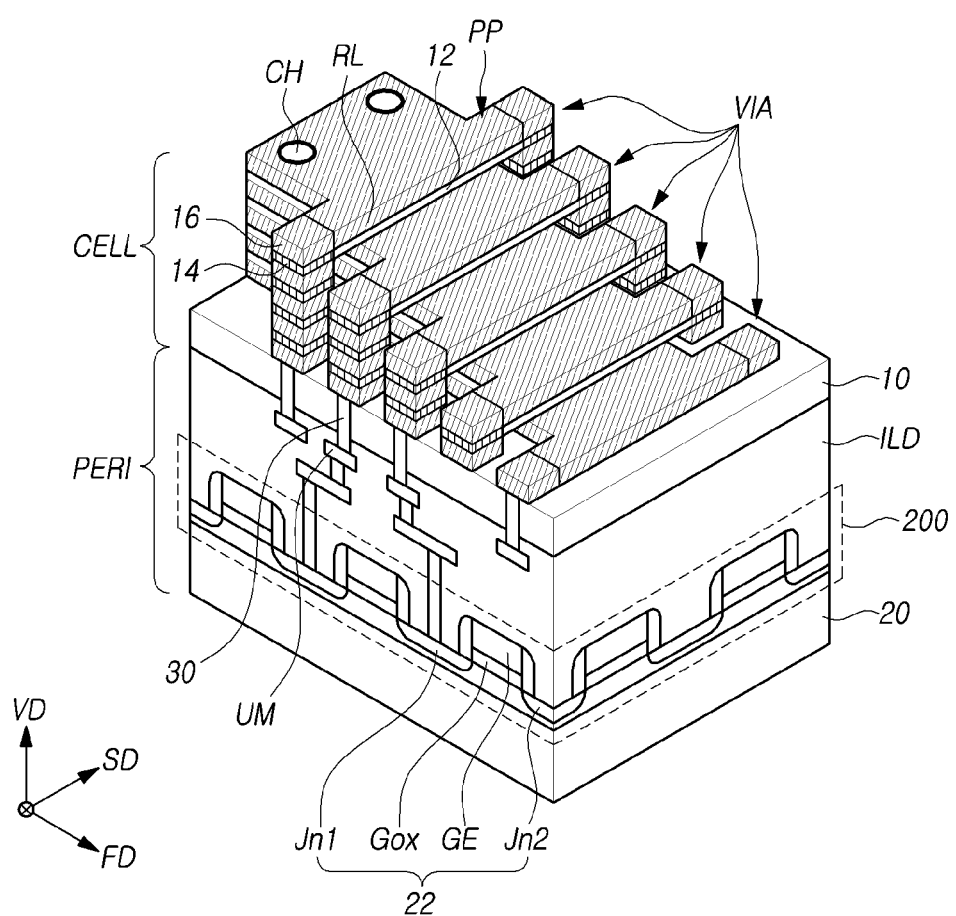
FIG. 2 is a perspective view illustrating a part of a three-dimensional memory device in accordance with an embodiment of the disclosure.
Figure 3:
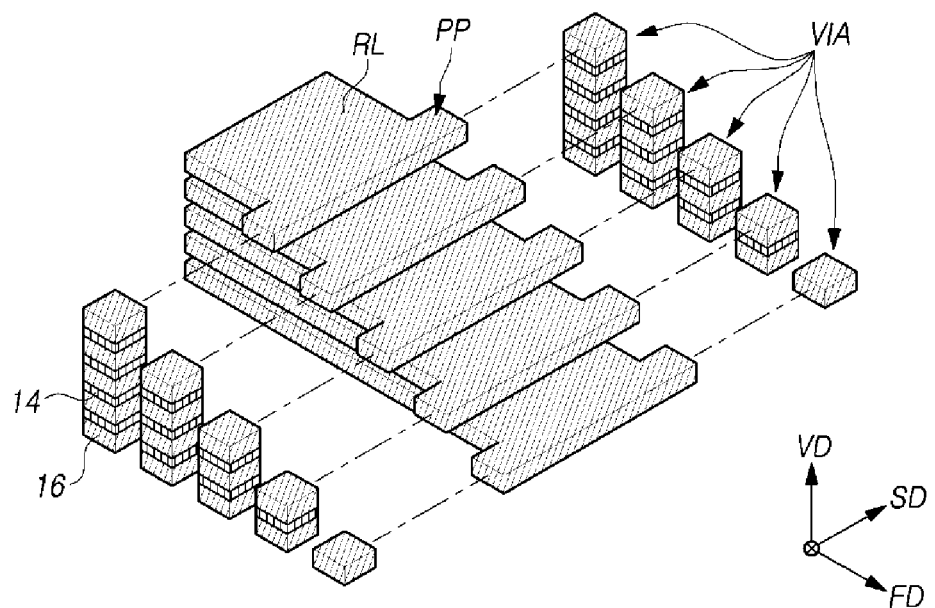
FIG. 3 is an exploded perspective view illustrating row lines and vias of FIG. 2.

FIG. 2 is a perspective view illustrating a part of a three-dimensional memory device in accordance with an embodiment of the disclosure, and FIG. 3 is an exploded perspective view illustrating row lines and vias of FIG. 2.

Referring to FIGS. 2 and 3, a three-dimensional memory device in accordance with an embodiment of the disclosure may include a plurality of row lines RL that are stacked alternately with a plurality of interlayer dielectric layers 12 on a first substrate 10 in the vertical direction VD. Each of the plurality of row lines RL and plurality of interlayer dielectric layers has a projection PP projecting from a side surface thereof. A plurality of vias VIA, which extend in the vertical direction VD from a top surface of the first substrate 10, are coupled to projections PP, respectively, of the plurality of row lines RL. The plurality of vias VIA electrically couple the plurality of row lines RL to a peripheral circuit 200 defined below the first substrate 10.

In more detail, the three-dimensional memory device in accordance with the embodiment of the disclosure may include a cell unit CELL and a peripheral circuit unit PERI, which is disposed under the cell unit CELL. The three-dimensional memory device in accordance with the embodiment of the disclosure may have a PUC (peripheral under cell) structure.

The cell unit CELL may include the first substrate 10, the plurality of row lines RL that are stacked alternately with the plurality of interlayer dielectric layers 12 on the first substrate 10, vertical channels CH that pass through the plurality of interlayer dielectric layers 12 and the plurality of row lines RL, and the plurality of vias VIA, which are coupled to the plurality of row lines RL, respectively.

The first substrate 10 may include a semiconductor layer that is formed with a dielectric layer on the surface thereof. The semiconductor layer may include, for example, a group IV semiconductor, a group III-V compound semiconductor or a group II-VI compound semiconductor. The dielectric layer may serve to isolate a lowermost row line RL, from among the row lines RL, from the semiconductor layer, and may include, for example, oxide.

Each of the row lines RL may extend in the first direction FD and may have a projection PP on a side surface thereof. Furthermore, each of the row lines RL may have a pair of projections PP extending in the second direction SD from both sides of an end portion of the row line in the first direction FD. In this case, for example, the row line RL may have a 'T' shape.

The end portions of the row lines RL, which are defined with the projections PP, may be disposed in a stepwise manner in the first direction FD. When viewed from the top, the projections PP of the row lines RL may be disposed at different positions.

Although the present embodiment illustrates a pair of projections PP for each row line RL, the disclosure is not limited thereto. Each row line RL may include one or more projections PP.

Among the row lines RL, at least one row line RL from a lowermost row line RL may configure a source select line, and at least one row line RL from an uppermost row line RL may configure a drain select line. Row lines RL between the source select line and the drain select line may configure word lines.

The interlayer dielectric layers 12 may be configured by oxide. For the sake of simplicity in illustration, FIG. 2 illustrates that the interlayer dielectric layers 12 are formed only between adjacent row lines RL, but the interlayer dielectric layers 12 may be formed not only between adjacent row lines RL, but also between the row lines RL and the vias VIA and between adjacent vias VIA.

Although not illustrated in detail, each of the vertical channels CH may include a channel layer and a gate dielectric layer. The channel layer may include polysilicon or monocrystalline silicon, and may include, in some regions thereof, a p-type impurity such as boron (B). The gate dielectric layer may have a shape that surrounds the outer wall of the channel layer. The gate dielectric layer may include a tunnel dielectric layer, a charge storage layer and a blocking layer, which are sequentially stacked from the outer wall of the channel layer. In some embodiments, the gate dielectric layer may have an ONO (oxide-nitride-oxide) stack structure in which an oxide layer, a nitride layer and an oxide layer are sequentially stacked.

A source select transistor may be configured in areas or regions where the source select line surrounds the vertical channel CH. Memory cells may be configured in areas or regions where the word lines surround the vertical channels CH. A drain select transistor may be configured in areas or regions where the drain select line surrounds the vertical channel CH. A source select transistor, a plurality of memory cells and a drain select transistor that are disposed along one vertical channel CH may configure one cell string.

The vias VIA may extend in the vertical direction VD from the top surface of the first substrate 10, and may each be directly coupled to a side surface of a projection PP of a corresponding row line RL. A top surface of each via VIA may be disposed on the same plane as a top surface of a corresponding row line RL.

Among the plurality of vias VIA, a via VIA coupled to a row line RL stacked for an n^th time from the first substrate 10 may include an n–1 number of first conductive patterns 14 and an n number of second conductive patterns 16 (where n is a natural number). For example, among the vias VIA, a via VIA coupled to the row line RL which is positioned at a lowermost layer (n=1) may be configured by one second conductive pattern 16. The via VIA coupled to the row line RL that is stacked immediately over (n=2) the lowermost row line RL may be configured by two second conductive patterns 16 and one first conductive pattern 14.

A first conductive pattern 14 may be disposed at the same vertical position as any one of the plurality of interlayer dielectric layers 12, and a second conductive pattern 16 may be disposed at the same vertical position as any one of the plurality of row lines RL.

The second conductive patterns 16 may be formed at the same process step as the row lines RL, and may be configured by the same conductive material as the row lines RL. For example, the row lines RL and the second conductive patterns 16 may include at least one selected from among a doped semiconductor (e.g., doped silicon), a metal (e.g., tungsten, copper or aluminum), conductive metal nitride (e.g., titanium nitride or tantalum nitride) and a transition metal (e.g., titanium or tantalum).

The peripheral circuit unit PERI may include a second substrate 20, the peripheral circuit 200, a dielectric layer ILD and bottom wiring lines UM. As described above with reference to FIG. 1, the peripheral circuit 200 may include a row decoder (210 of FIG. 1), a page buffer circuit (220 of FIG. 1), a control logic (230 of FIG. 1), a voltage generator (240 of FIG. 1), a column decoder (250 of FIG. 1) and an input/output buffer (260 of FIG. 1).

The peripheral circuit 200 may include a peripheral circuit element 22, and the peripheral circuit element 22 may include a planar transistor. The planar transistor may include a gate dielectric layer Gox, which is formed on the second substrate 20, a gate electrode GE, which is formed on the gate dielectric layer Gox, and junctions Jn1 and Jn2, which are defined in an active region of the second substrate 20 on both sides of the gate electrode GE. The junctions Jn1 and Jn2 are regions that are defined by implanting an n-type or p-type impurity into the active region of the second substrate 20. One of the junctions, Jn1 or Jn2, may be used as a source region of the planar transistor, and the other may be used as a drain region of the planar transistor. The peripheral circuit element 22 may configure one of the row decoder (210 of FIG. 1), the page buffer circuit (220 of FIG. 1), the control logic (230 of FIG. 1), the voltage generator (240 of FIG. 1), the column decoder (250 of FIG. 1) and the input/output buffer (260 of FIG. 1).

The dielectric layer ILD may be formed on the second substrate 20 to cover the peripheral circuit 200. The bottom wiring lines UM may be disposed in the dielectric layer ILD, and may be electrically coupled to the peripheral circuit 200.

A contact 30 may be defined under each via VIA, may pass through the first substrate 10 and the dielectric layer ILD, and may couple the via VIA and a bottom wiring line UM corresponding thereto. Each via VIA may be electrically coupled to the peripheral circuit 200 through the contact 30 and the bottom wiring line UM, and may electrically couple a corresponding row line RL and the peripheral circuit 200.

Hereinbelow, a method for manufacturing a cell unit CELL of a three-dimensional memory device illustrated in FIG. 2 will be described with reference to FIGS. 4 to 7.

Figure 4:
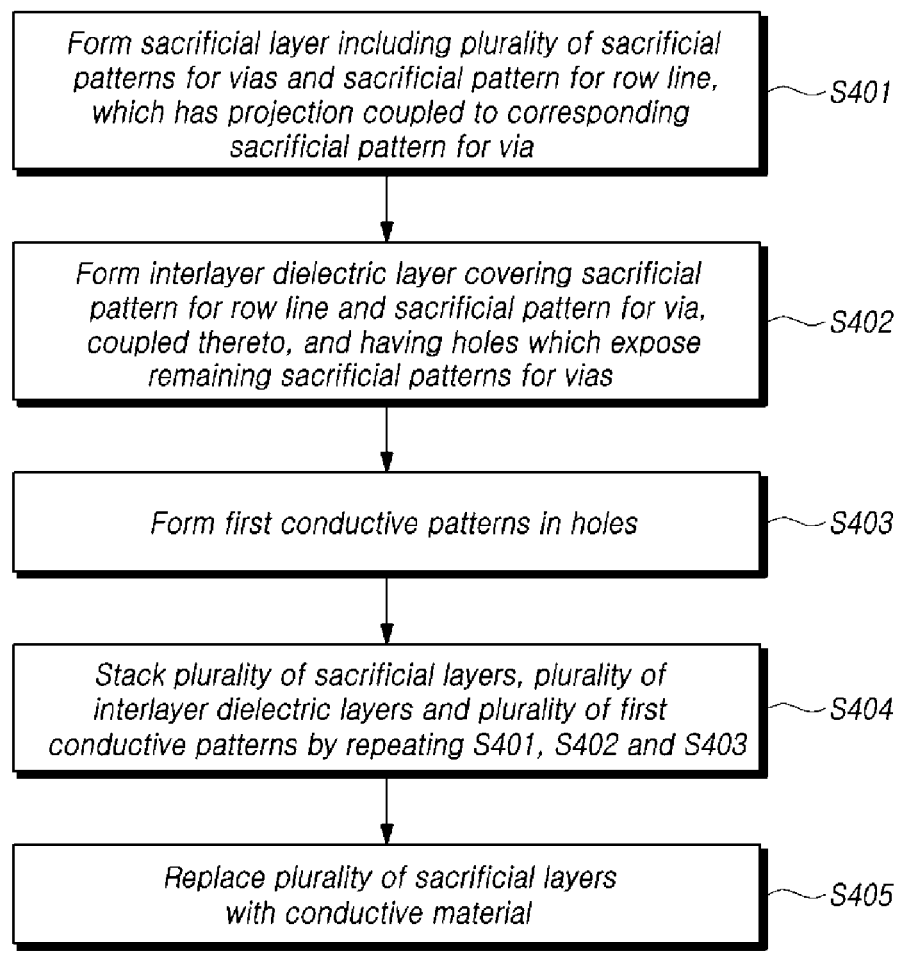
FIG. 4 is a flow chart illustrating a method for manufacturing a three-dimensional memory device in accordance with an embodiment of the disclosure.

FIG. 4 is a flow chart illustrating a method for manufacturing a three-dimensional memory device in accordance with an embodiment of the disclosure, FIGS. 5A to 5F are perspective views illustrating, by process steps, a three-dimensional memory device in accordance with an embodiment of the disclosure. FIGS. 6A to 6F are sectional views taken along lines A-A' of FIGS. 5A to 5F, and FIG. 7 is a perspective view illustrating sacrificial layers and first conductive patterns at the step of FIG. 5F.

Referring to FIGS. 4 to 7, a method for manufacturing a three-dimensional memory device in accordance with an embodiment of the disclosure may include step S401 of forming, on a first substrate 10, a sacrificial layer 11 including a plurality of sacrificial patterns 11B for vias and a sacrificial pattern 11A for a row line. The sacrificial pattern 11A has a projection PA coupled to a corresponding sacrificial pattern 11B for a via. The method next includes step S402 of forming an interlayer dielectric layer 12 covering the sacrificial pattern 11A and the sacrificial pattern 11B and having a plurality of holes H that expose the remaining sacrificial patterns 11B for vias not coupled to the sacrificial pattern 11A. The method further includes step S403 of forming a plurality of first conductive patterns 14 in the plurality of holes H. Subsequently, in step S404, a plurality of sacrificial layers 11, a plurality of interlayer dielectric layers 12 and a plurality of first conductive patterns 14 are stacked by repeating the step S401 of forming the sacrificial layer 11, the step S402 of forming the interlayer dielectric layer 12 and the step S403 of forming the plurality of first conductive patterns 14. The method also includes step S405 of replacing the plurality of sacrificial layers 11 with a conductive material.

Figure 5A:
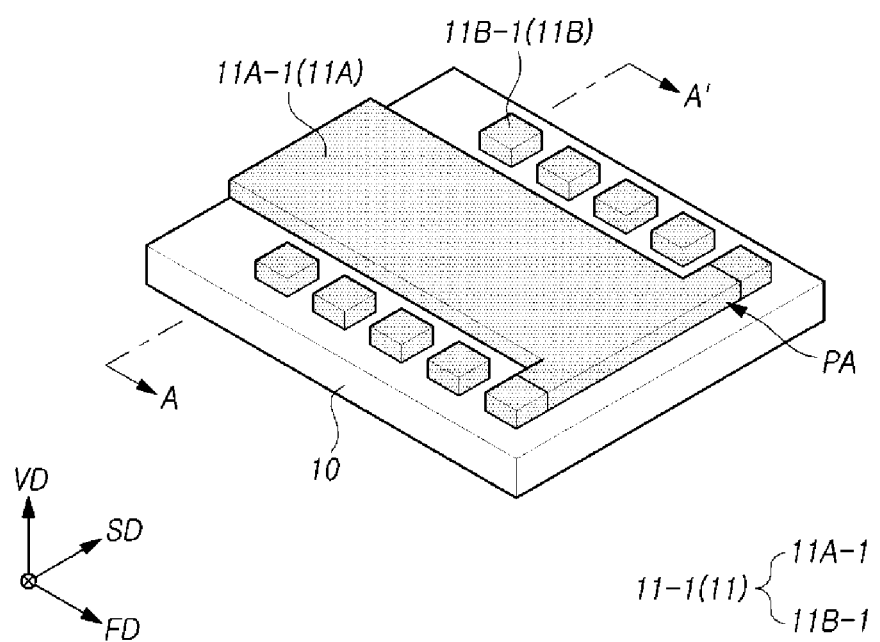
FIGS. 5A to 5F are perspective views illustrating, by process steps, a three-dimensional memory device in accordance with an embodiment of the disclosure.
Figure 6A:
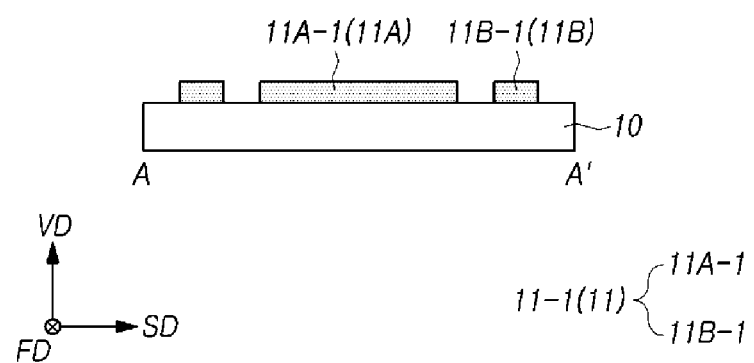
FIGS. 6A to 6F are sectional views taken along lines A-A' of FIGS. 5A to 5F.

In detail, referring to FIGS. 5A and 6A, a sacrificial layer 11-1 (11) may be formed on the first substrate 10, and by patterning the sacrificial layer 11-1 through a photolithographic process, a sacrificial pattern 11A-1 (11A) for a row line and a plurality of sacrificial patterns 11B-1 (11B) for vias may be formed. The sacrificial layer 11-1 may be configured by nitride.

The sacrificial pattern 11A-1 for a row line may extend in the first direction FD, and may have a projection PA on a side surface thereof. The plurality of sacrificial patterns 11B-1 for vias may be arranged in the first direction FD, as the extending direction of the sacrificial pattern 11A-1 for a row line, in the vicinity of the sacrificial pattern 11A-1.

The projection PA of the sacrificial pattern 11A-1 for a row line may be coupled to at least one of the plurality of sacrificial patterns 11B-1 for vias. For example, in FIG. 5A, the sacrificial pattern 11A-1 for a row line may have a pair of projections PA projecting from both side surfaces thereof at an end portion of the sacrificial pattern 11A-1 in the first direction FD. The projections PA of the sacrificial pattern 11A-1 for a row line may be coupled to a pair of sacrificial patterns 11B-1 for vias, respectively, which are disposed on the first substrate 10 and are at an outermost position in the first direction FD from among the plurality of sacrificial patterns 11B-1 for vias.

Figure 5B:
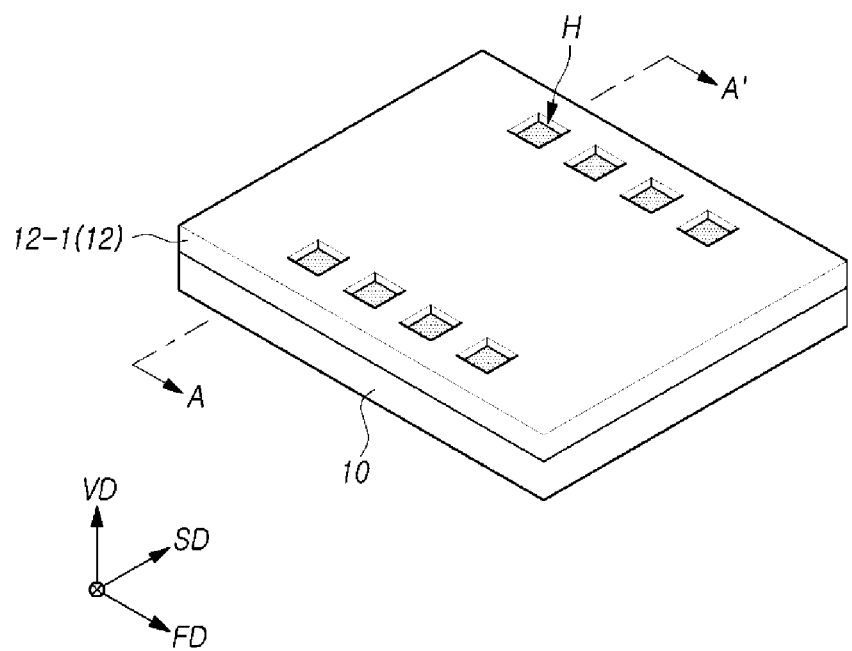
Figure 6B:
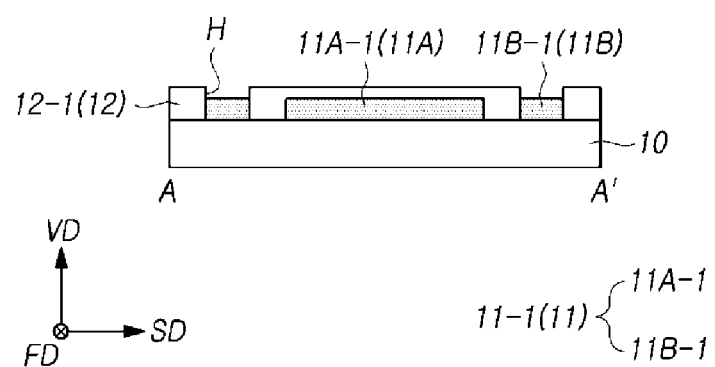

Referring to FIGS. 5B and 6B, an interlayer dielectric layer 12-1 (12), which covers the sacrificial layer 11-1, may be formed on the first substrate 10. The interlayer dielectric layer 12-1 may be configured by a dielectric material that has an etching selectivity with respect to the sacrificial layer 11-1. For example, in the case where the sacrificial layer 11-1 is configured by nitride, the interlayer dielectric layer 12-1 may be configured by oxide.

The plurality of holes H that expose sacrificial patterns 11B-1 for vias not coupled to the sacrificial pattern 11A-1 may be formed in the interlayer dielectric layer 12-1. For example, as shown in FIG. 5A, if the sacrificial pattern 11A-1 for a row line is coupled to the pair of sacrificial patterns 11B-1 for vias positioned outermost in the first direction FD, as shown in FIG. 5B, the plurality of holes H that expose the remaining sacrificial patterns 11B-1 for vias, except the pair of sacrificial patterns 11B-1 for vias positioned outermost and coupled to the sacrificial pattern 11A-1, may be formed in the interlayer dielectric layer 12-1 (12). The sacrificial pattern 11A-1 for a row line and the sacrificial patterns 11B-1 for vias coupled thereto may be covered by the interlayer dielectric layer 12-1.

Figure 5C:
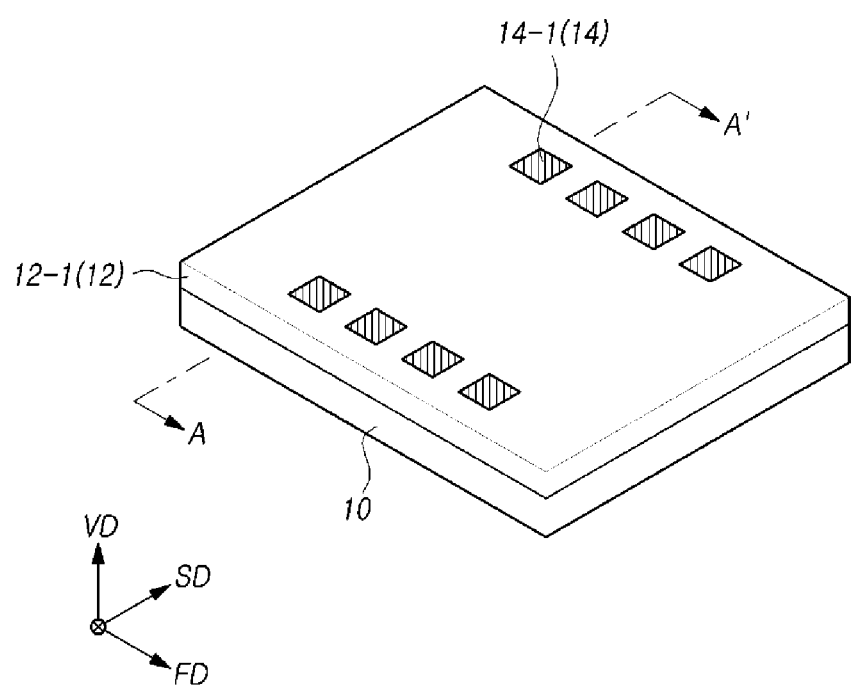
Figure 6C:
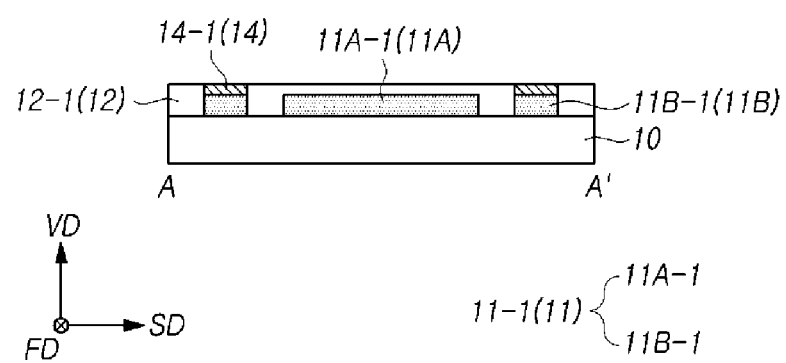

Referring to FIGS. 5C and 6C, first conductive patterns 14-1 (14) may be formed in the plurality of holes H, respectively. For example, after a conductive material is used to fill the plurality of holes H and to cover the interlayer dielectric layer 12-1, the conductive material formed on the interlayer dielectric layer 12-1 may be removed through a CMP (chemical mechanical polishing) process so that the conductive material remains only in the plurality of holes H.

Figure 5D:
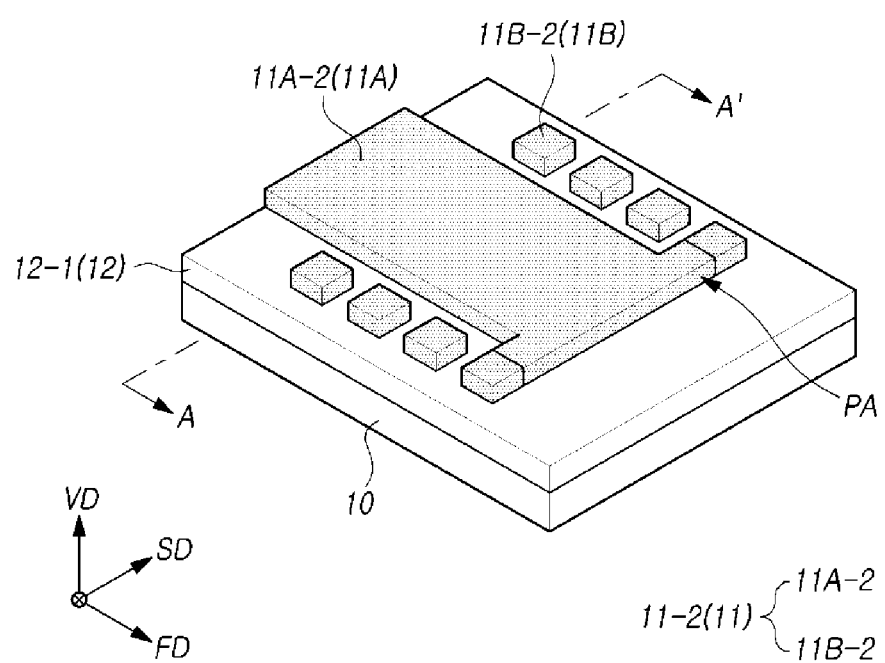
Figure 6D:
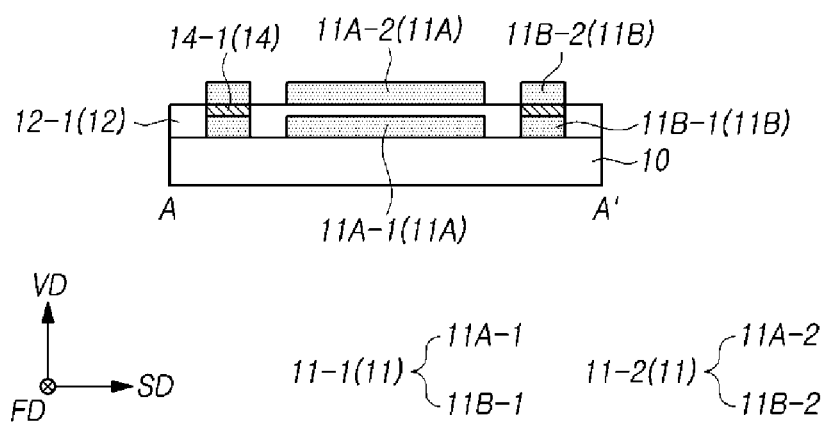

Referring to FIGS. 5D and 6D, a sacrificial layer 11-2 (11), which covers the first conductive patterns 14-1 and the interlayer dielectric layer 12-1 may be formed. The sacrificial layer 11-2 may be configured by the same material as the underlying sacrificial layer 11-1, such as, for example, nitride.

As the sacrificial layer 11-2 is patterned through a photolithographic process, a sacrificial pattern 11A-2 (11A) for a row line and a plurality of sacrificial patterns 11B-2 (11B) for vias may be formed.

The sacrificial pattern 11A-2 for a row line may extend in the first direction FD, and may have a projection PA on a side surface thereof. A length of the sacrificial pattern 11A-2 for a row line in the first direction FD may be shorter than a length of the sacrificial pattern 11A-1 for a row line (see FIG. 5A) in the first direction FD.

Except for the projection PA, the sacrificial pattern 11A-2 for a row line may overlap with the sacrificial pattern 11A-1 for a row line in the vertical direction VD. The projection PA of the sacrificial pattern 11A-2 for a row line may be coupled to at least one of the plurality of sacrificial patterns 11B-2 for vias. For example, the sacrificial pattern 11A-2 for a row line may have a pair of projections PA at an end portion thereof in the first direction FD, and the projections PA of the sacrificial pattern 11A-2 for a row line may be coupled to a pair of sacrificial patterns 11B-2 for vias, respectively, which are positioned outermost in the first direction FD among the plurality of sacrificial patterns 11B-2.

Figure 5E:
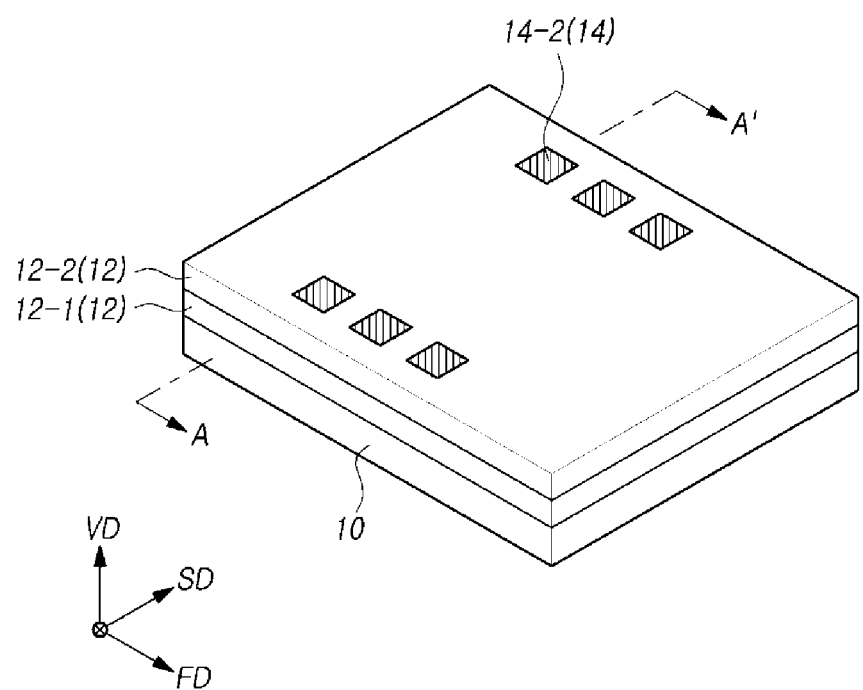
Figure 6E:
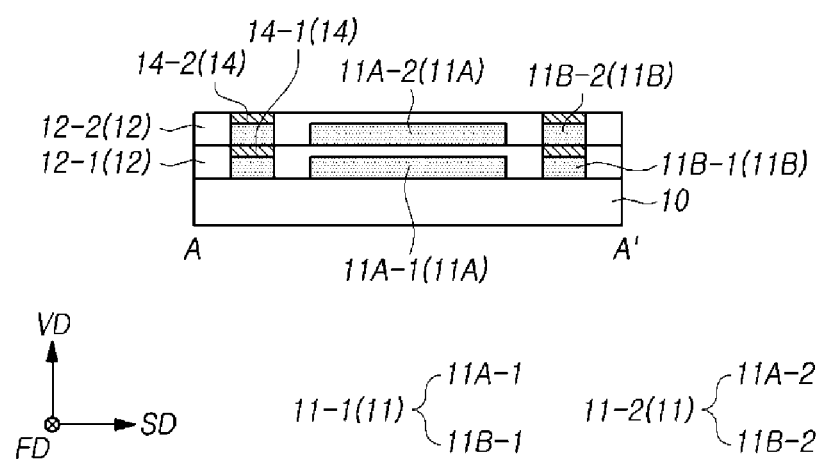

Referring to FIGS. 5E and 6E, an interlayer dielectric layer 12-2 (12), which covers the sacrificial layer 11-2, may be formed on the interlayer dielectric layer 12-1 (12). The interlayer dielectric layer 12-2 may be configured by the same material as the underlying interlayer dielectric layer 12-1, such as for example, oxide.

A plurality of holes (not illustrated) that expose sacrificial patterns 11B-2 for vias that are not coupled to the sacrificial pattern 11A-2 for a row line, from among the plurality of sacrificial patterns 11B-2 for vias, may be formed in the interlayer dielectric layer 12-2. For example, if the sacrificial pattern 11A-2 for a row line is coupled to the pair of sacrificial patterns 11B-2 for vias positioned outermost in the first direction FD, then the plurality of holes that expose the remaining sacrificial patterns 11B-2 for vias, except for the pair of sacrificial patterns 11B-2 for vias positioned outermost in the first direction FD, may be formed in the interlayer dielectric layer 12-2 (12). The sacrificial pattern 11A-2 for a row line and the sacrificial patterns 11B-2 for vias coupled thereto may be covered by the interlayer dielectric layer 12-2.

First conductive patterns 14-2 (14) may be formed in the plurality of holes, respectively.

Figure 5F:
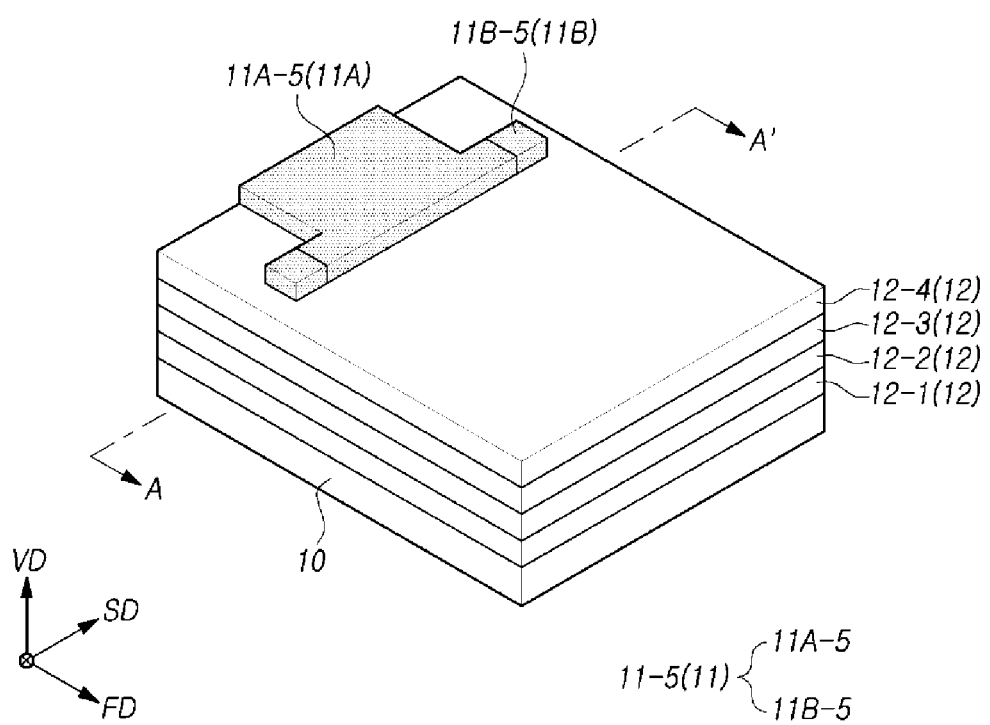
Figure 6F:
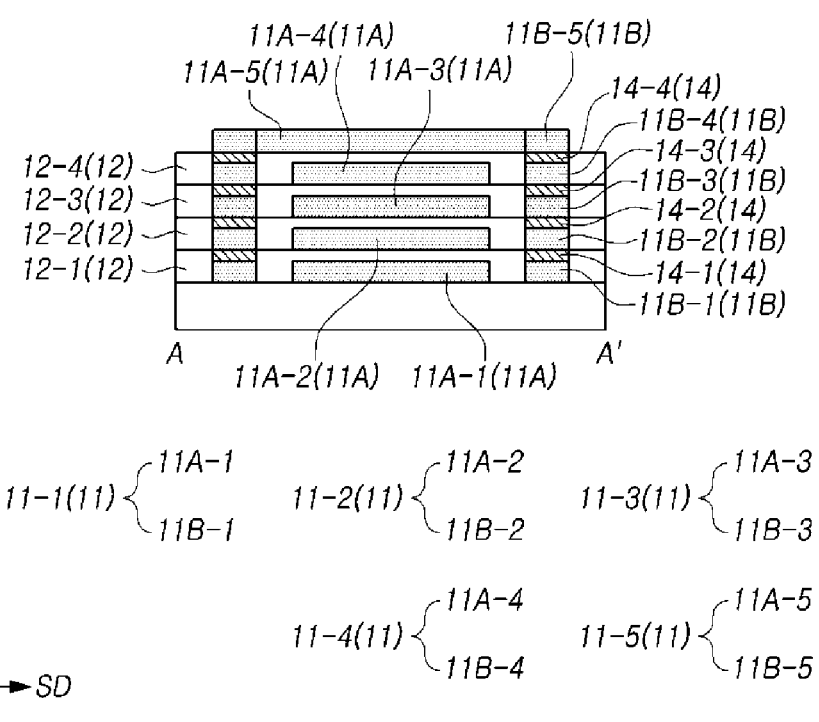

Referring to FIGS. 5F and 6F, as the step of forming the sacrificial layer 11, the step of forming the interlayer dielectric layer 12 and the step of forming the first conductive patterns 14 are repeated, a plurality of sacrificial layers 11-1 to 11-5 (11), a plurality of interlayer dielectric layers 12-1 to 12-4 (12) and a plurality of first conductive patterns 14-1 to 14-4 (14) may be stacked.

Figure 7:
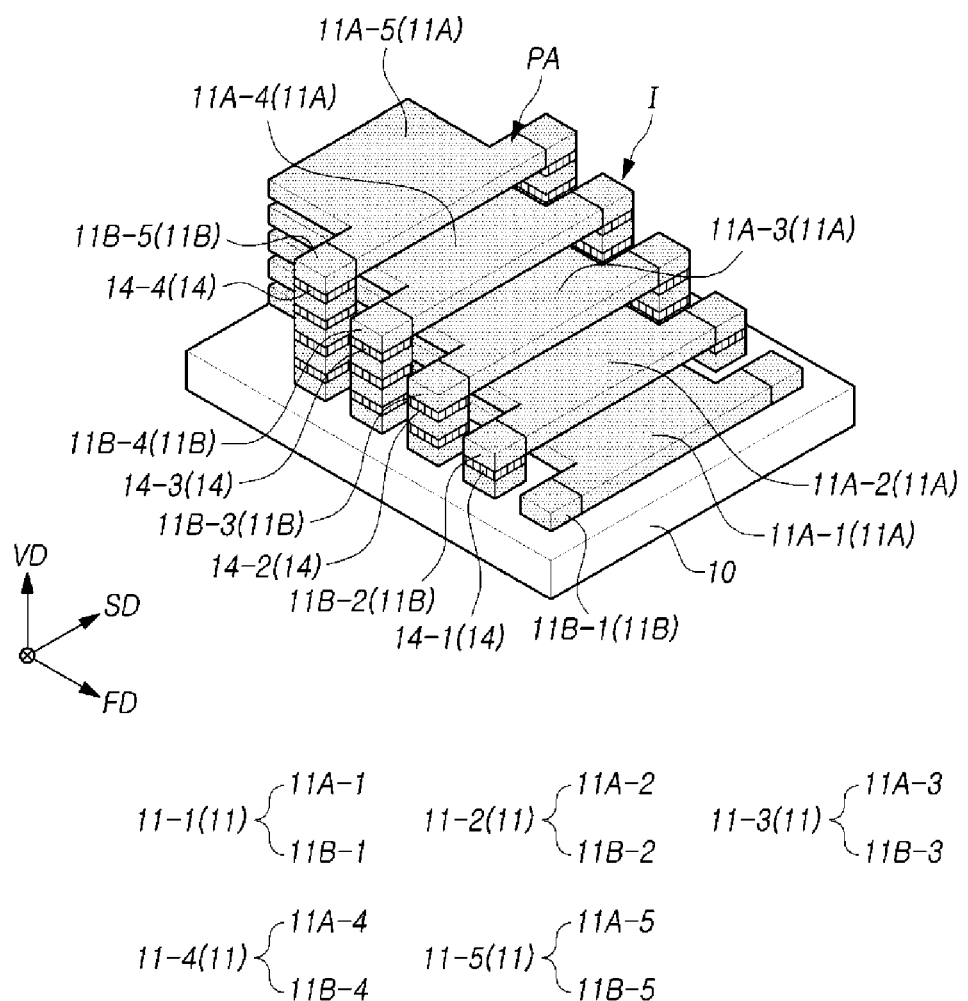
FIG. 7 is a perspective view illustrating sacrificial layers and first conductive patterns at the step of FIG. 5F.

Referring to FIG. 7, end portions of sacrificial patterns 11A-1 to 11A-5 for row lines, which are defined with projections PA, may be disposed in a staircase structure in the first direction FD.

Vertical pillars I may be coupled to the projections PA, respectively, of the sacrificial patterns 11A-1 to 11A-5 for row lines. The vertical pillars I may extend in the vertical direction VD from the top surface of the first substrate 10, and may each be coupled to the side surface of a corresponding sacrificial pattern (one of 11A-1 to 11A-5) for a row line. The top surface of each vertical pillar I may be disposed on the same plane as the top surface of a corresponding sacrificial pattern (one of 11A-1 to 11A-5) for a row line.

Among the vertical pillars I, a vertical pillar I that is coupled to a sacrificial pattern 11A for a row line stacked for an n^th time from the first substrate 10 may be configured by an n number of sacrificial patterns 11B for vias and an n−1 number of first conductive patterns 14. For example, a vertical pillar I coupled to the sacrificial pattern 11A-1 for a row line positioned at a lowermost layer (n=1) may be configured by one sacrificial pattern 11B for a via. Furthermore, vertical pillar I coupled to the sacrificial pattern 11A-2 for a row line (n=2) stacked immediately over the sacrificial pattern 11A-1 for a row line may be configured by two sacrificial patterns 11B for vias and one first conductive pattern 14.

Thereafter, as the sacrificial patterns 11A-1 to 11A-5 for row lines and the sacrificial patterns 11B-1 to 11B-5 for vias are replaced with a conductive material, a plurality of row lines (RL of FIG. 2) and a plurality of second conductive patterns (16 of FIG. 2) may be formed as illustrated in FIG. 2. In the embodiment described with reference to FIGS. 4 to 7, it shows a case where the end portions of sacrificial patterns 11A-1 to 11A-5 common to the projections PA, are disposed in a staircase structure, but the disclosure is not limited thereto. Although not shown in the drawings, in another embodiment, the end portions of sacrificial patterns 11A-1 to 11A-5 may not be disposed in a staircase structure.

Hereinafter, a three-dimensional memory device and a manufacturing method thereof in accordance with another embodiment of the disclosure will be described with reference to FIGS. 8 to 16C. In the following description, repeated explanation for the same components as those explained in the above embodiment will be omitted.

Figure 8:
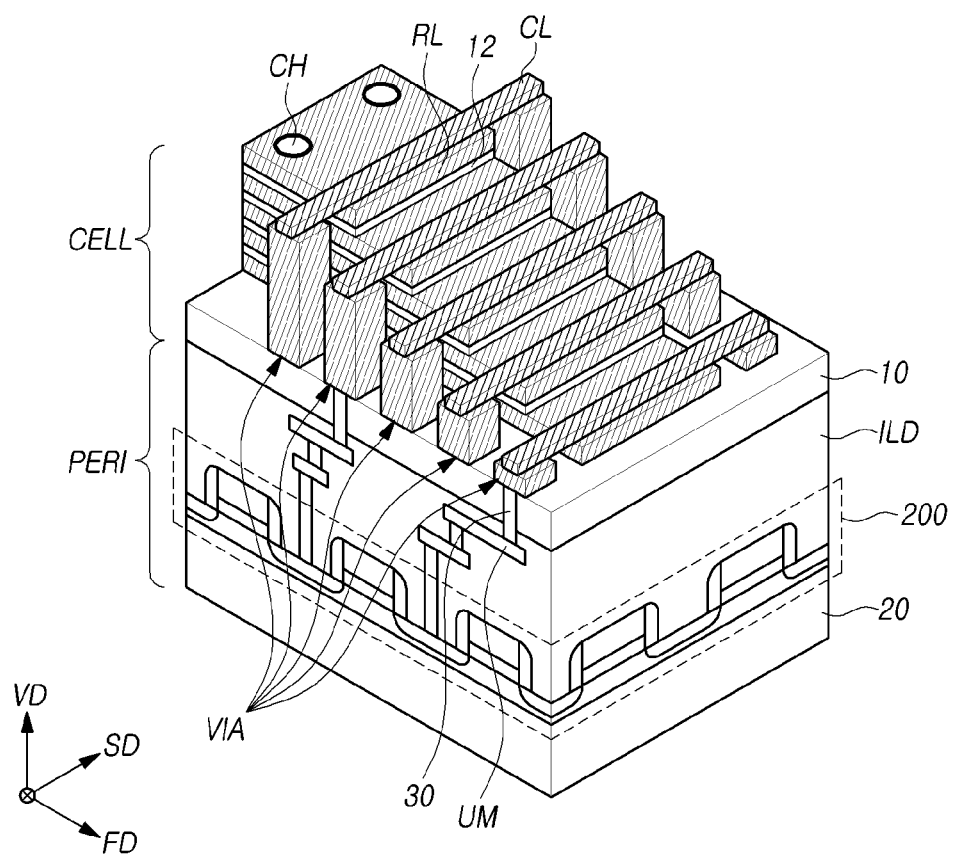
FIG. 8 is a perspective view illustrating a part of a three-dimensional memory device in accordance with another embodiment of the disclosure.
Figure 9:
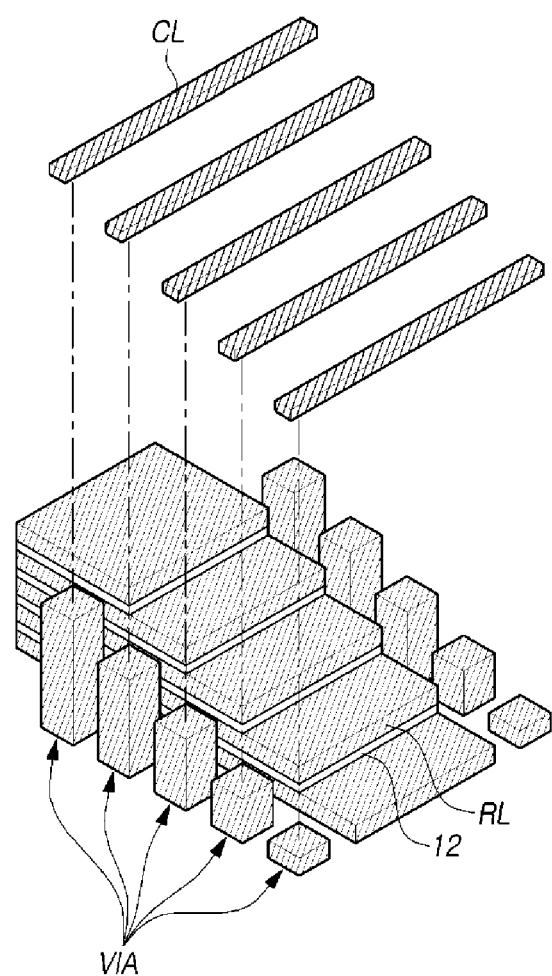
FIG. 9 is an exploded perspective view illustrating row lines, vias and coupling lines of FIG. 8.

FIG. 8 is a perspective view illustrating a part of a three-dimensional memory device in accordance with another embodiment of the disclosure, and FIG. 9 is an exploded perspective view illustrating row lines, vias and coupling lines of FIG. 8.

Referring to FIGS. 8 and 9, a three-dimensional memory device in accordance with an embodiment of the disclosure may include a plurality of row lines RL, which are stacked alternately with a plurality of interlayer dielectric layers 12 on a first substrate 10 in the vertical direction VD, a plurality of coupling lines CL, which are directly coupled onto the plurality of row lines RL, respectively, and a plurality of vias VIA that extend in the vertical direction VD from the first substrate 10. The plurality of vias VIA are coupled respectively to projections of the plurality of coupling lines CL that extend past the side surfaces of the plurality of row lines RL. The plurality of vias VIA electrically couple the plurality of row lines RL and a peripheral circuit 200 defined below the first substrate 10.

In more detail, as described above with reference to FIGS. 2 and 3, the three-dimensional memory device in accordance with an embodiment of the disclosure may include a cell unit CELL and a peripheral circuit unit PERI, which is disposed under the cell unit CELL.

The cell unit CELL may include the first substrate 10, the plurality of row lines RL, a plurality of vertical channels CH, the plurality of coupling lines CL, and the plurality of vias VIA.

The row lines RL may extend in different lengths in the first direction FD, and end portions of the row lines RL may be disposed in a staircase structure in the first direction FD.

The interlayer dielectric layers 12 may be configured by oxide. For the sake of simplicity in illustration, FIG. 8 illustrates that the interlayer dielectric layers 12 are formed only between adjacent row lines RL, but the disclosure is not limited thereto. In some embodiments, the interlayer dielectric layers 12 may be configured to fill the spaces between the row lines RL and the vias VIA and to fill the spaces between adjacent vias VIA.

In some other embodiments, the interlayer dielectric layers 12 may be formed only between adjacent row lines RL. A slit dielectric layer (e.g., 40 of FIG. 15F) may be disposed in the spaces between the row lines RL and the vias VIA, and supports (e.g., 19 of FIG. 15F) may be disposed in the spaces between adjacent vias VIA. The plurality of supports (19 of FIG. 15F) may be disposed alternately with the plurality of vias VIA in the first direction FD.

The coupling lines CL may correspond to the plurality of row lines RL, respectively, and may each be directly coupled to the end portion of a corresponding row line RL. Each coupling line CL may have a projection that projects beyond a side surface of a corresponding row line RL in the second direction SD.

Each of the vias VIA may be disposed adjacent to the end of a corresponding row line RL in the second direction SD. For example, a pair of vias VIA may be disposed, in the second direction SD, on both sides of the end portion of a corresponding row line RL. Although the present embodiment illustrates a pair of vias VIA that corresponds to one row line RL, the disclosure is not limited thereto. The number of vias VIA corresponding to one row line RL may be one.

The vias VIA may extend in the vertical direction VD from the top surface of the first substrate 10, and the top surface of each via VIA may be disposed on the same plane as the top surface of a corresponding row line RL. Each via VIA may be directly coupled to a bottom surface of the projection of a corresponding coupling line CL, and may be coupled to a corresponding row line RL through the coupling line CL.

The row lines RL, the vias VIA and the coupling lines CL may be formed at the same process step, and may be configured by the same material. For example, the row lines RL, the vias VIA and the coupling lines CL may include at least one selected from among a doped semiconductor (e.g., doped silicon), a metal (e.g., tungsten, copper or aluminum), conductive metal nitride (e.g., titanium nitride or tantalum nitride) and a transition metal (e.g., titanium or tantalum).

A contact 30 may be defined under each via VIA, may pass through the first substrate 10 and a dielectric layer ILD, and may couple the via VIA and a bottom wiring line UM corresponding thereto. Each via VIA may be electrically coupled to the peripheral circuit 200 through the contact 30 and the bottom wiring line UM, and may electrically couple a corresponding row line RL to a peripheral circuit 200.

Figure 10:
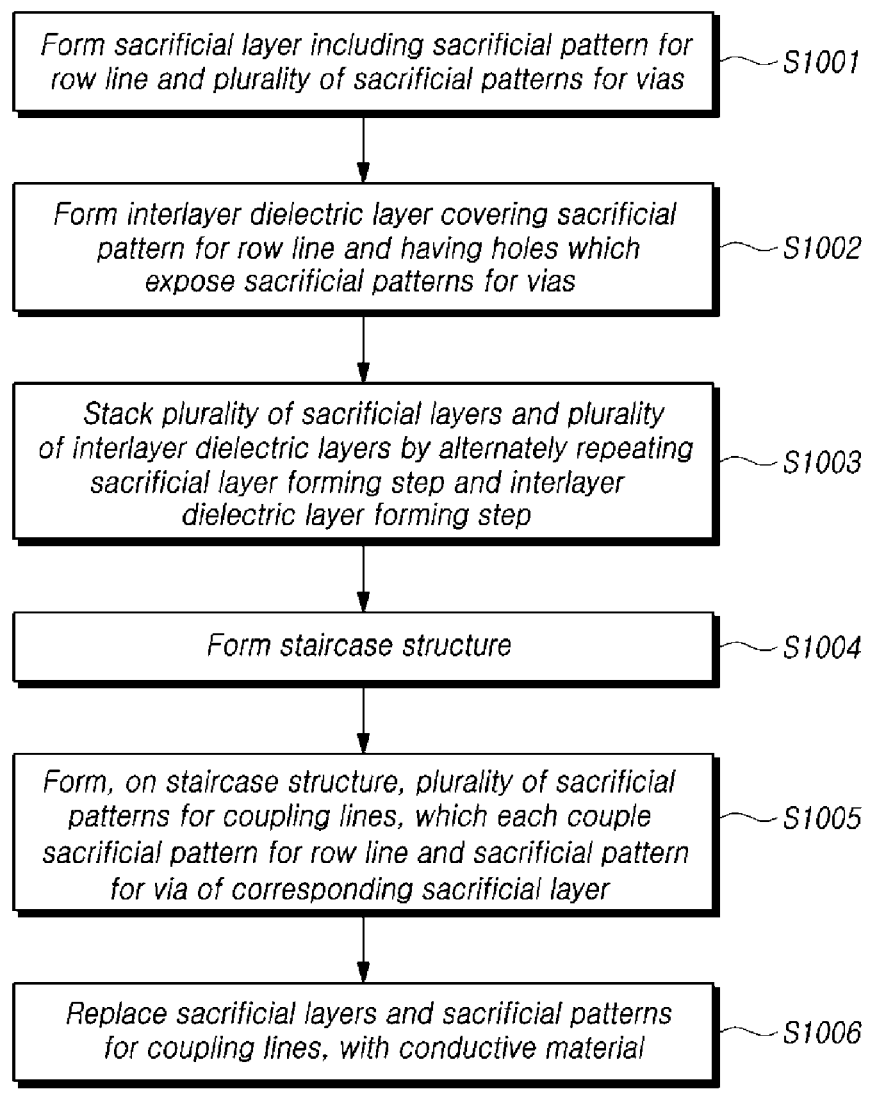
FIG. 10 is a flow chart illustrating a method for manufacturing a three-dimensional memory device in accordance with another embodiment of the disclosure.
Figure 11A:
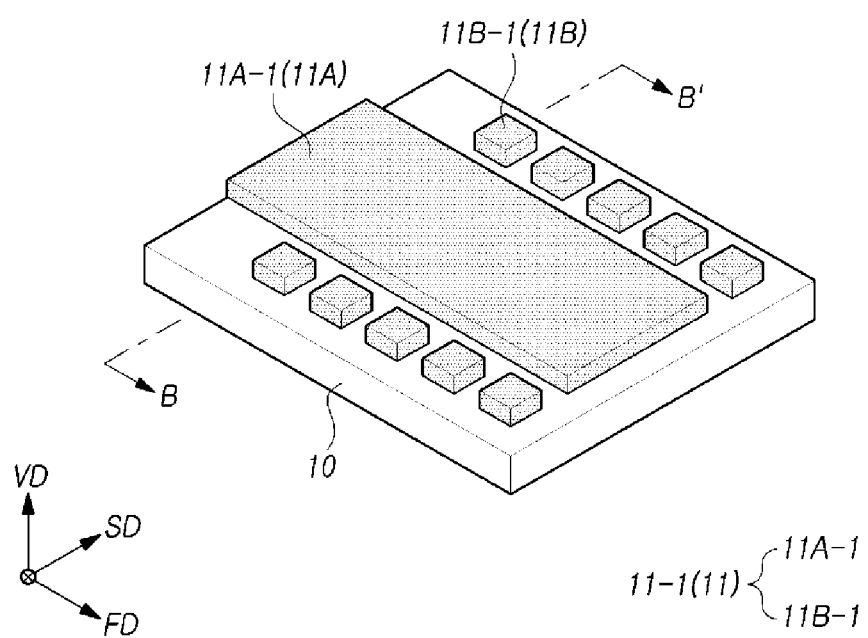
FIGS. 11A to 11H are perspective views illustrating, by process steps, a three-dimensional memory device in accordance with another embodiment of the disclosure.
Figure 11B:
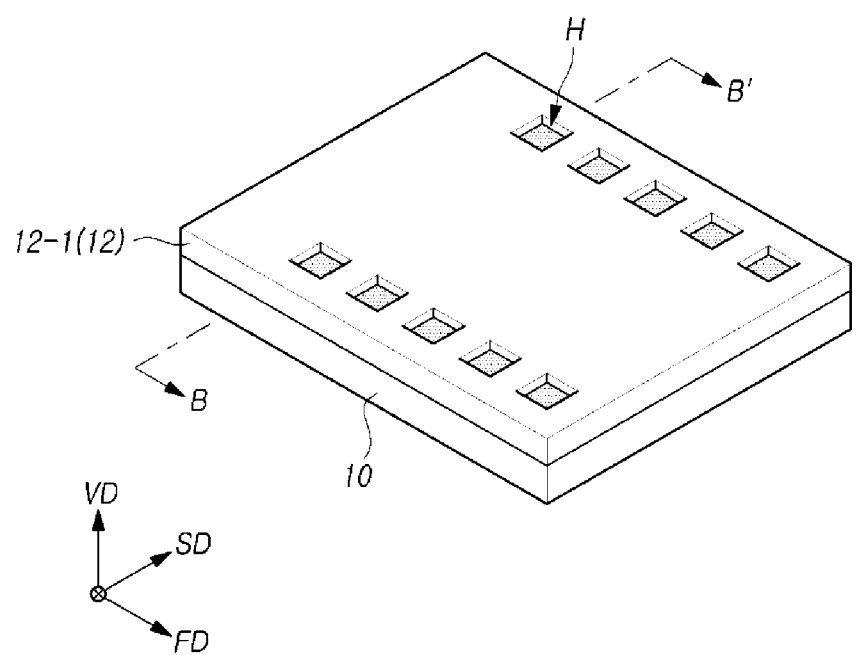
Figure 11C:
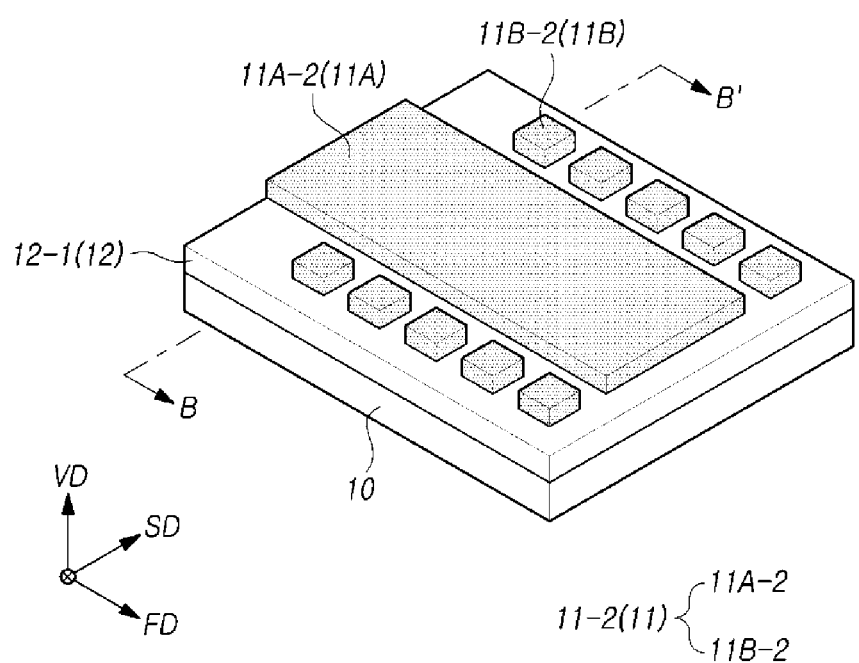
Figure 11D:
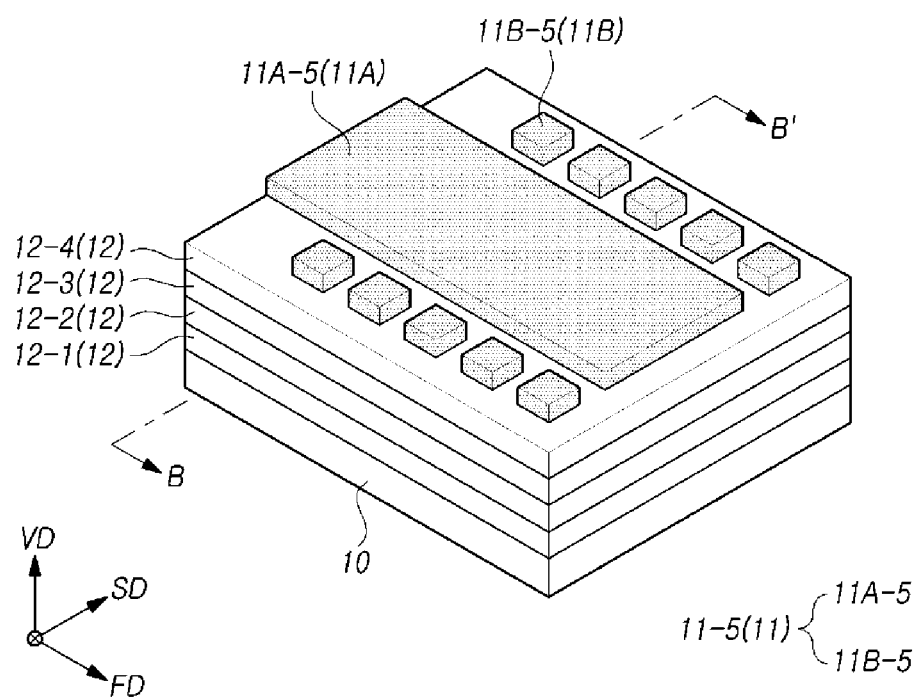
Figure 11E:
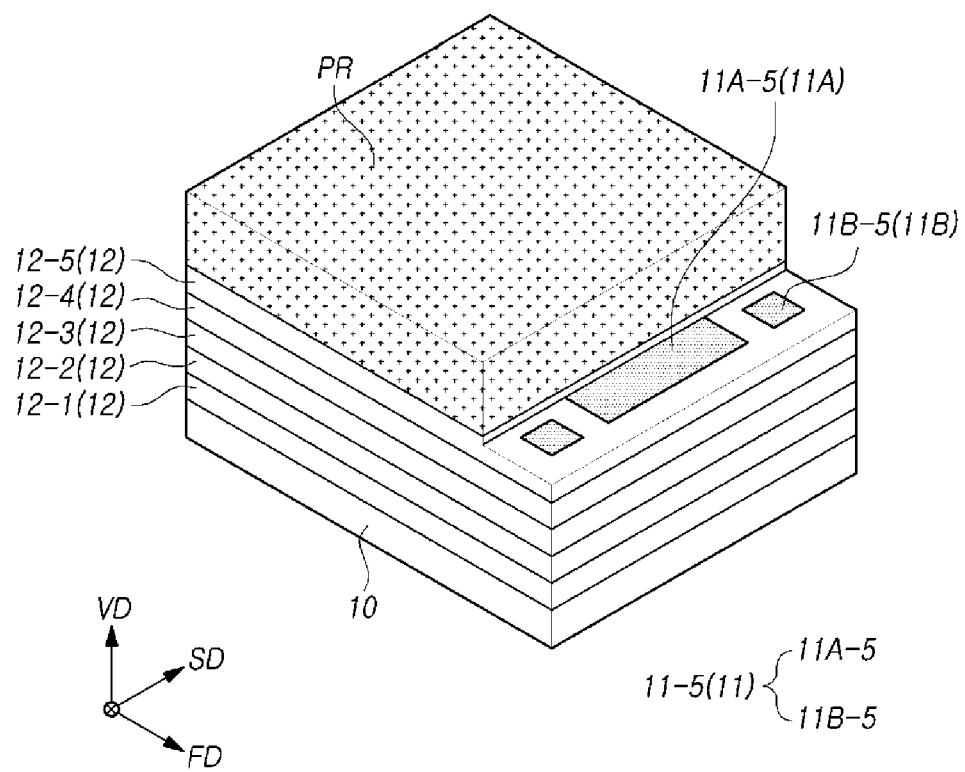
Figure 11F:
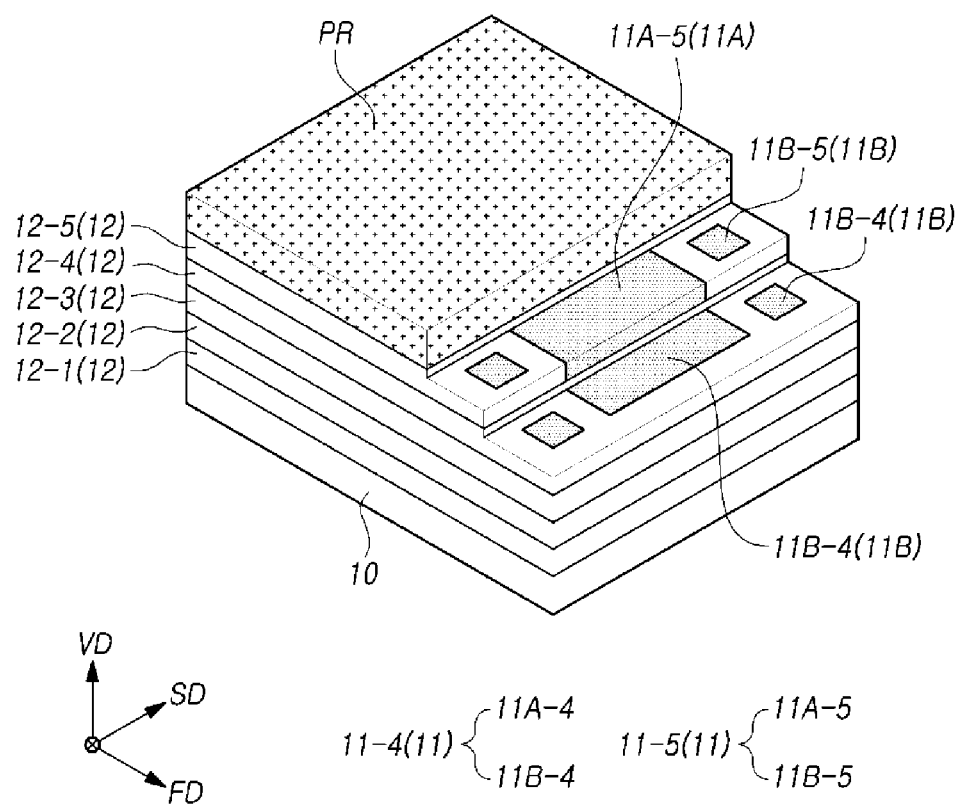
Figure 11G:
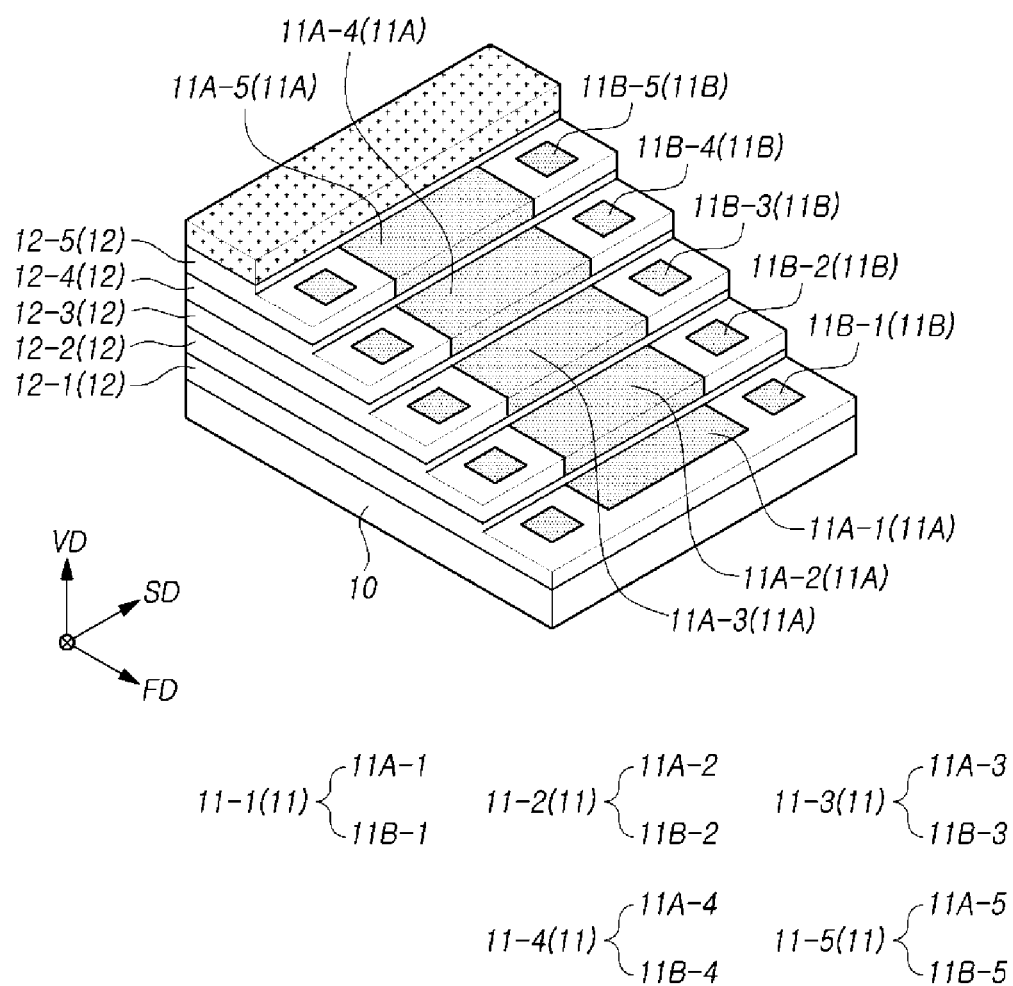
Figure 11H:
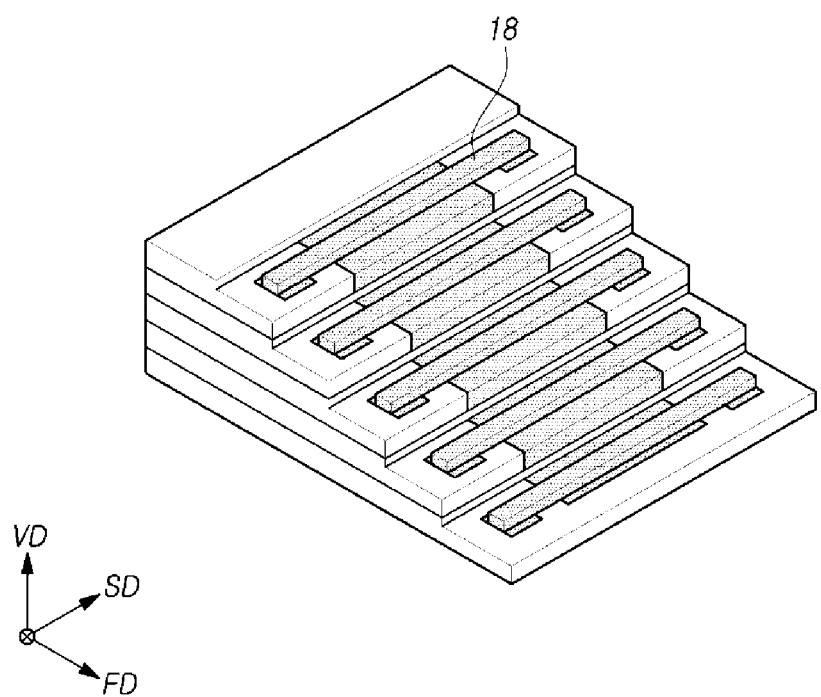

FIG. 10 is a flow chart illustrating a method for manufacturing a three-dimensional memory device in accordance with another embodiment of the disclosure, FIGS. 11A to 11H are perspective views illustrating, by process steps, a three-dimensional memory device in accordance with another embodiment of the disclosure, FIGS. 12A to 12D are sectional views taken along lines B-B' of FIGS. 11A to 11D, and FIG. 13 is a perspective view illustrating sacrificial layers and sacrificial patterns for coupling lines of a three-dimensional memory device illustrated in FIG. 11H.

Referring to FIGS. 10 to 13, a method for manufacturing a three-dimensional memory device in accordance with an embodiment of the disclosure may include a step S1001 of forming, on a first substrate 10, a sacrificial layer 11 including a sacrificial pattern 11A for a row line and a plurality of sacrificial patterns 11B for vias; a step S1002 of forming an interlayer dielectric layer 12 covering the sacrificial pattern 11A for a row line and having a plurality of holes H that expose the plurality of sacrificial patterns 11B for vias; a step S1003 of stacking a plurality of sacrificial layers 11 and a plurality of interlayer dielectric layers 12 by alternately repeating the step S1001 of forming the sacrificial layer 11 and the step S1002 of forming the interlayer dielectric layer 12; a step S1004 of forming a staircase structure that exposes respective portions of the sacrificial layers 11; a step S1005 of forming, on the staircase structure, a plurality of sacrificial patterns 18 for coupling lines, which correspond to the sacrificial layers 11, respectively, each coupling the sacrificial pattern 11A for a row line and the sacrificial pattern 11B for a via of a corresponding sacrificial layer 11; and a step S1006 of replacing the plurality of sacrificial layers 11 and the plurality of sacrificial patterns 18 for coupling lines, with a conductive material.

Figure 12A:
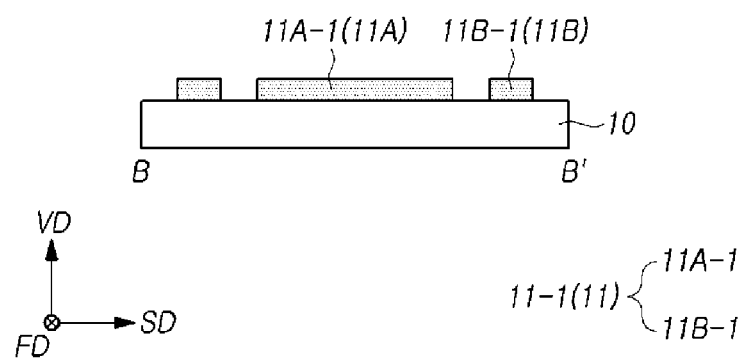
FIGS. 12A to 12D are sectional views taken along lines B-B' of FIGS. 11A to 11D.

In detail, referring to FIGS. 11A and 12A, a sacrificial layer 11-1 (11) may be formed on the first substrate 10, and by patterning the sacrificial layer 11-1 through a photolithographic process, a sacrificial pattern 11A-1 (11A) for a row line and a plurality of sacrificial patterns 11B-1 (11B) for vias may be formed. The sacrificial layer 11-1 may be configured by nitride.

The sacrificial pattern 11A-1 for a row line may have a line shape which extends in the first direction FD. The plurality of sacrificial patterns 11B-1 for vias may be arranged in the first direction FD, as the extending direction of the sacrificial pattern 11A-1 for a row line, in the vicinity of the sacrificial pattern 11A-1 for a row line.

Figure 12B:
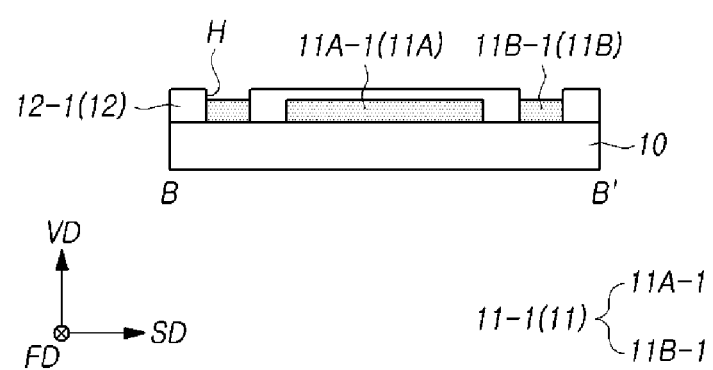

Referring to FIGS. 11B and 12B, an interlayer dielectric layer 12-1 (12) that covers the sacrificial layer 11-1 may be formed on the first substrate 10. The interlayer dielectric layer 12-1 may be configured by a dielectric material that has an etching selectivity with respect to the sacrificial layer 11-1. For example, if the sacrificial layer 11-1 is configured by nitride, then the interlayer dielectric layer 12-1 may be configured by oxide.

A plurality of holes H, which expose the plurality of sacrificial patterns 11B-1 for vias, may be formed in the interlayer dielectric layer 12-1. The sacrificial pattern 11A-1 for a row line may be covered with the interlayer dielectric layer 12-1.

Figure 12C:
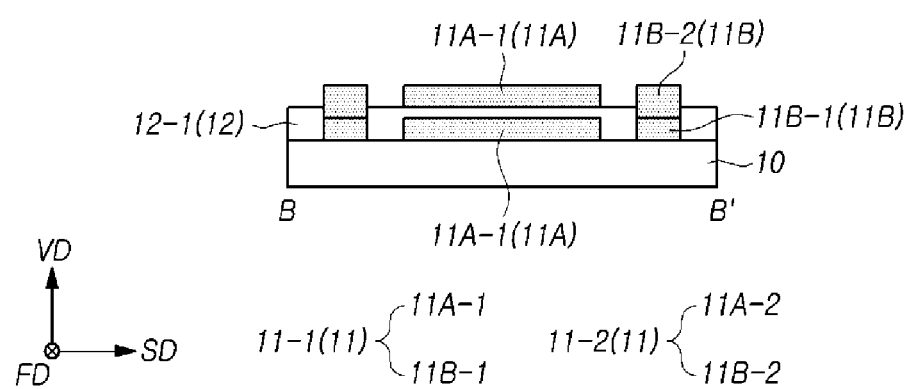

Referring to FIGS. 11C and 12C, a sacrificial layer 11-2 (11), which fills the plurality of holes H and covers the interlayer dielectric layer 12-1, may be formed. The sacrificial layer 11-2 may be formed of the same material as the underlying sacrificial layer 11-1, for example, nitride.

As the sacrificial layer 11-2 is patterned through a photolithographic process, a sacrificial pattern 11A-2 (11A) for a row line and a plurality of sacrificial patterns 11B-2 (11B) for vias may be formed. In the photolithographic process for patterning the sacrificial layer 11-2, a mask pattern having the same structure as a mask pattern used in the photolithographic process for patterning the underlying sacrificial layer 11-1 may be used. Accordingly, the sacrificial pattern 11A-2 for a row line may have the same layout structure as the underlying sacrificial pattern 11A-1 for a row line. The sacrificial pattern 11A-2 may be disposed to overlap with the sacrificial pattern 11A-1 for a row line in the vertical direction VD. Further, the plurality of sacrificial patterns 11B-2 for vias may have the same layout structure as the plurality of underlying sacrificial patterns 11B-1 for vias, and may be disposed to overlap with the plurality of sacrificial patterns 11B-1 for vias in the vertical direction VD.

Figure 12D:
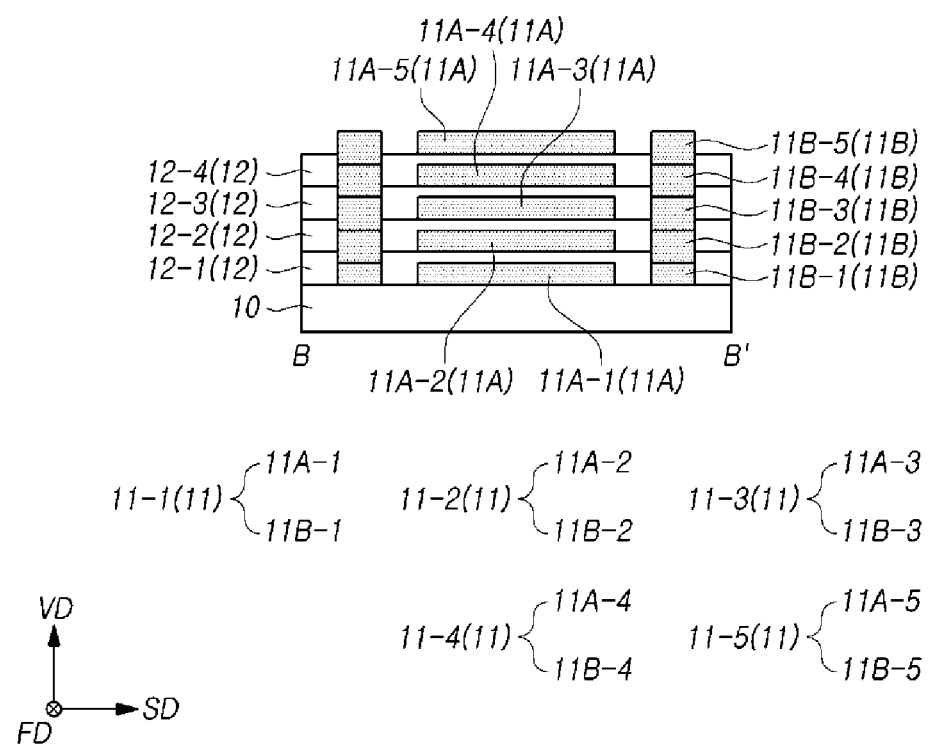

Referring to FIGS. 11D and 12D, as the step of forming the sacrificial layer 11 and the step of forming the interlayer dielectric layer 12 are alternately repeated, a plurality of sacrificial layers 11-1 to 11-5 (11) and a plurality of interlayer dielectric layers 12-1 to 12-4 (12) may be stacked.

Referring to FIG. 11E, after an interlayer dielectric layer 12-5, which covers the sacrificial layer 11-5, is formed on the interlayer dielectric layer 12-4, a mask pattern PR may be formed on the interlayer dielectric layer 12-5. The mask pattern PR may expose a part of the top surface of the interlayer dielectric layer 12-5.

A pad etching process of etching a part of a stack, including the plurality of sacrificial layers 11-1 to 11-5 (11) and the plurality of interlayer dielectric layers 12-1 to 12-5 (12), by using the mask pattern PR as an etch mask may be performed. In the pad etching process, the stack may be etched to a depth at which the sacrificial layer 11-5 is exposed.

Referring to FIG. 11F, a trimming process of reducing the area of the mask pattern PR may be performed. Through the trimming process, an area exposed by the mask pattern PR may be increased, and thus, a part of the top surface of the sacrificial layer 11-5 may be additionally exposed.

The trimming process may horizontally move the sidewall of the mask pattern PR by a predetermined distance in the first direction FD. The horizontal movement distance of the sidewall of the mask pattern PR may correspond to a width, in the first direction FD, of one step included in the staircase structure described above with reference to FIG. 8. For instance, as the trimming process, an isotropic dry etching method or a wet etching method may be used. During the trimming process, as the entire surface of the mask pattern PR is etched, the top surface of the mask pattern PR may be recessed. That is to say, by the trimming process, the area and thickness of the mask pattern PR may be reduced.

A pad etching process of etching a part of the stack by using the trimmed mask pattern PR as an etch mask may be performed. In the pad etching process, the stack may be etched to a depth at which the sacrificial layer 11-4 is exposed.

In succession, the trimming process and the pad etching process may be alternately and repeatedly performed. The number of repetitions of the trimming process and the pad etching process may vary depending on the stack number of sacrificial layers 11. For example, when the stack number of sacrificial layers 11 is m (m is a natural number of 2 or more), the number of repetitions may be m−1. The present embodiment illustrates five sacrificial layers 11 stacked, and, in this case, the number of repetitions may be four.

As the etching process and the trimming process are repeated, as illustrated in FIG. 11G, a staircase structure that exposes end portions of the sacrificial layers 11-1 to 11-5 may be formed.

The mask pattern PR may be configured by a photoresist. The mask pattern PR remaining after the staircase structure is formed may be removed through a strip process.

Referring to FIG. 11H, a plurality of sacrificial patterns 18 for coupling lines may be formed on the staircase structure.

The plurality of sacrificial patterns 18 for coupling lines may correspond to the plurality of sacrificial layers 11-1 to 11-5 (11) (see FIG. 11G), respectively, and may each couple the sacrificial pattern 11A for a row line (see FIG. 11G) and the sacrificial pattern 11B for a via (see FIG. 11G) of a corresponding sacrificial layer 11 (see FIG. 11G). Each sacrificial pattern 18 for a coupling line may be directly coupled to the top surfaces of a corresponding sacrificial pattern 11A for a row line (see FIG. 11G) and a corresponding sacrificial pattern 11B for a via (see FIG. 11G).

Figure 13:
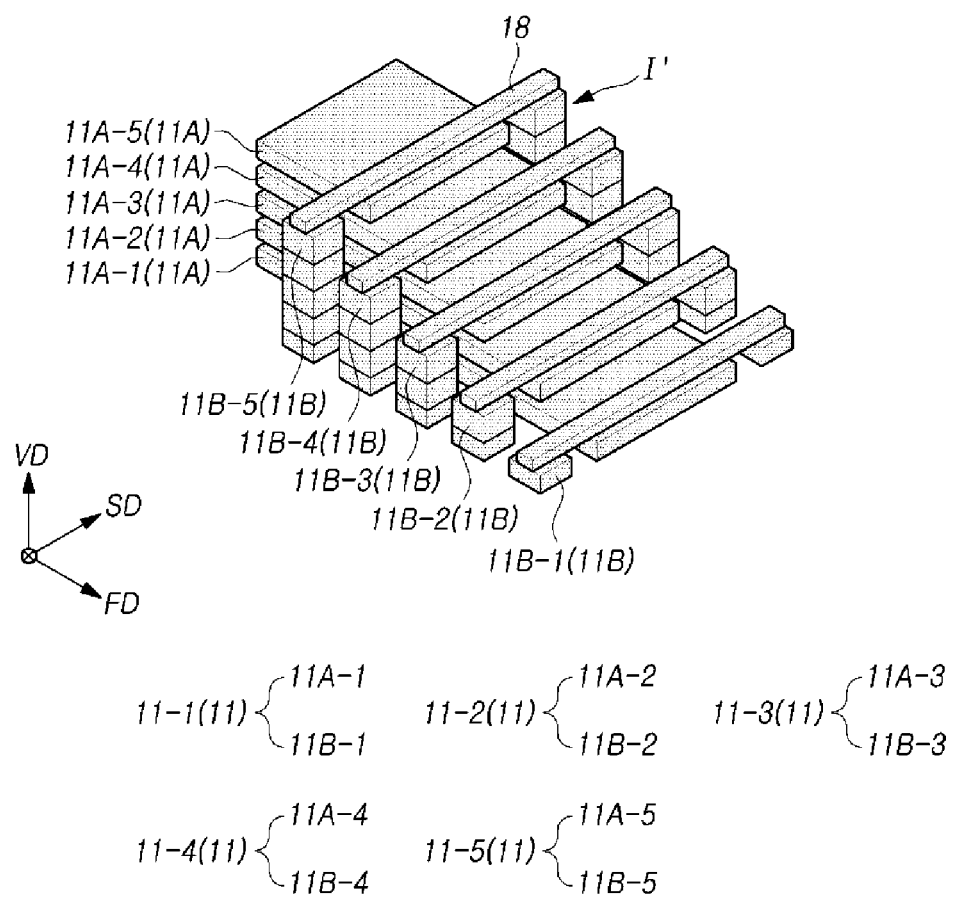
FIG. 13 is a perspective view illustrating sacrificial layers and sacrificial patterns for coupling lines of a three-dimensional memory device illustrated in FIG. 11H.

Referring to FIG. 13, end portions of the sacrificial patterns 11A-1 to 11A-5 for row lines may be disposed in a staircase structure in the first direction FD.

When viewed from the top, vertical pillars I' may be disposed at positions, respectively, adjacent to ends of the sacrificial patterns 11A-1 to 11A-5 for row lines in the second direction SD. Each vertical pillar I' may extend in the vertical direction VD from the top surface of the first substrate 10, and the top surface of the vertical pillar I' may be disposed on the same plane as the top surface of a corresponding sacrificial pattern (one of 11A-1 to 11A-5) for a row line.

Each of the vertical pillars I' may be configured as at least one sacrificial pattern 11B for a via or more than one stacked sacrificial patterns 11B. The number of sacrificial patterns 11B for vias may vary depending on a stack position of a sacrificial pattern 11A for a row line corresponding to the vertical pillar I'. For example, in the case where a sacrificial pattern 11A for a row line corresponding to a vertical pillar I' is stacked for a k^th time (where k is a natural number) from the first substrate 10, the stack number of sacrificial patterns 11B for vias, which configure the vertical pillar I', may be k.

As the sacrificial patterns 11A-1 to 11A-5 (11A) for row lines, the sacrificial patterns 11B-1 to 11B-5 (11B) for vias and the sacrificial patterns 18 for coupling lines are replaced with a conductive material, the plurality of row lines RL, the plurality of vias VIA and the plurality of coupling lines CL may be formed as illustrated in FIG. 8.

Figure 14:
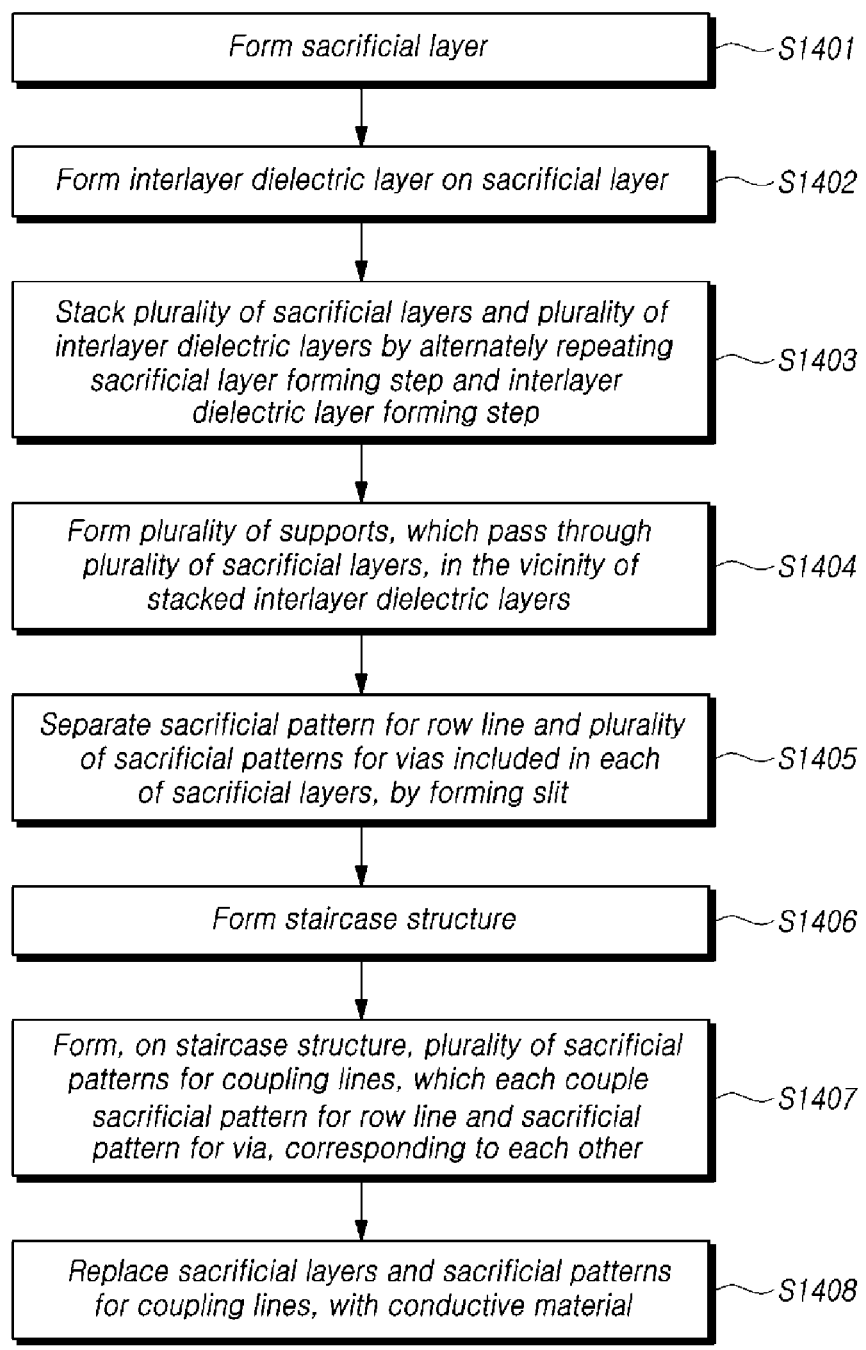
FIG. 14 is a flow chart illustrating a method for manufacturing a three-dimensional memory device in accordance with still another embodiment of the disclosure.
Figure 15A:
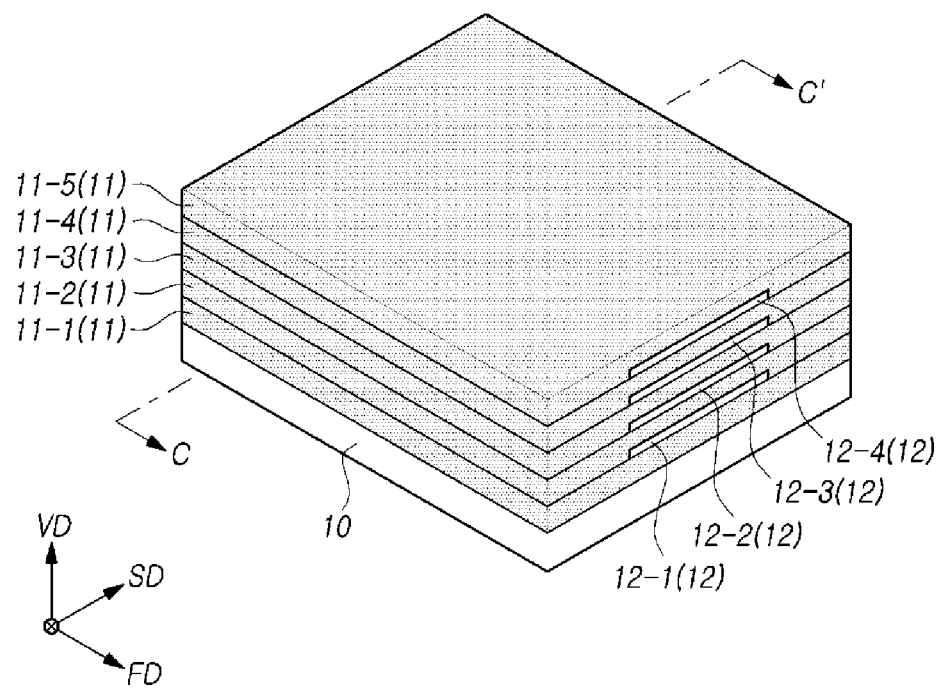
FIGS. 15A to 15G are perspective views illustrating, by process steps, a three-dimensional memory device in accordance with still another embodiment of the disclosure.
Figure 15B:
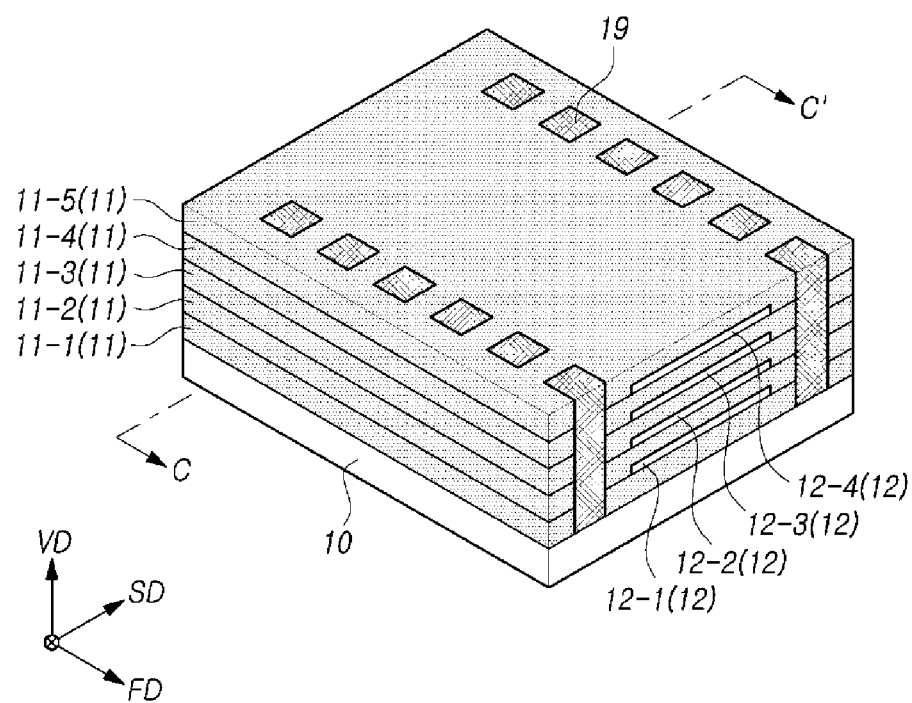
Figure 15C:
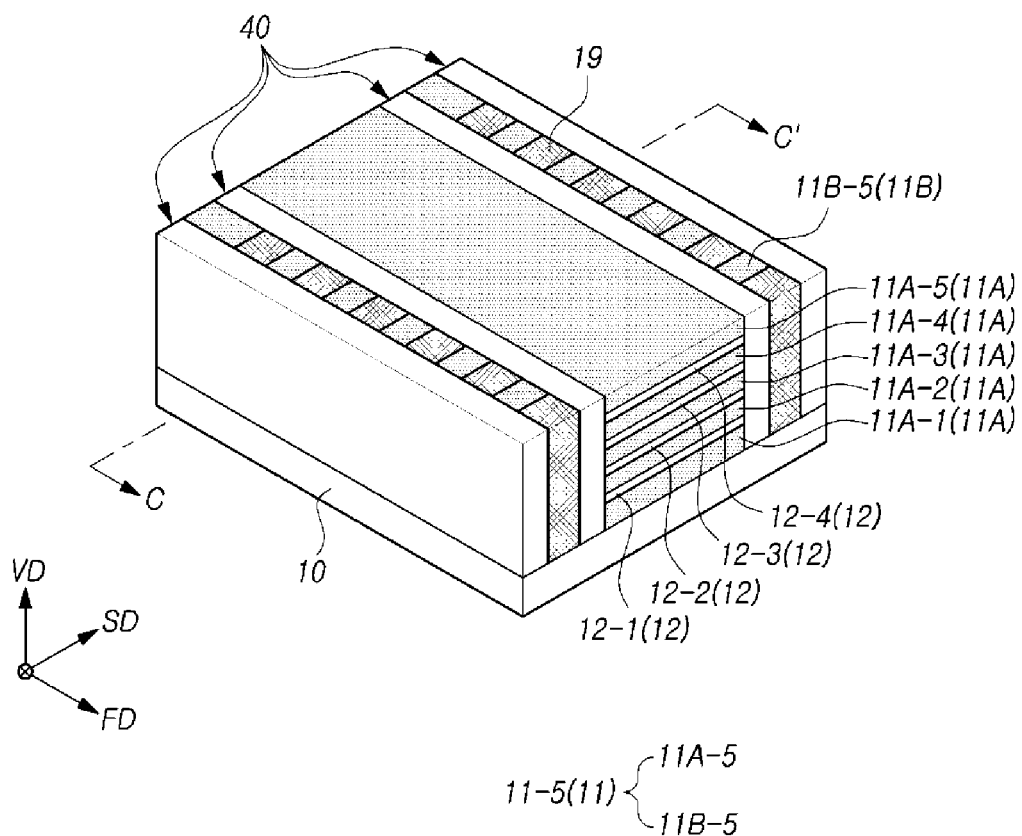
Figure 15D:
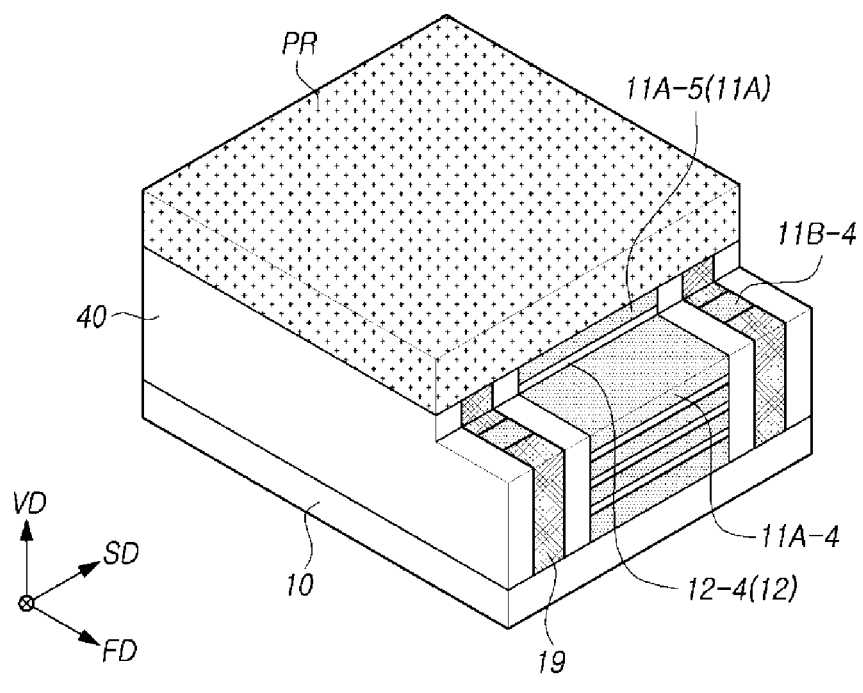
Figure 15E:
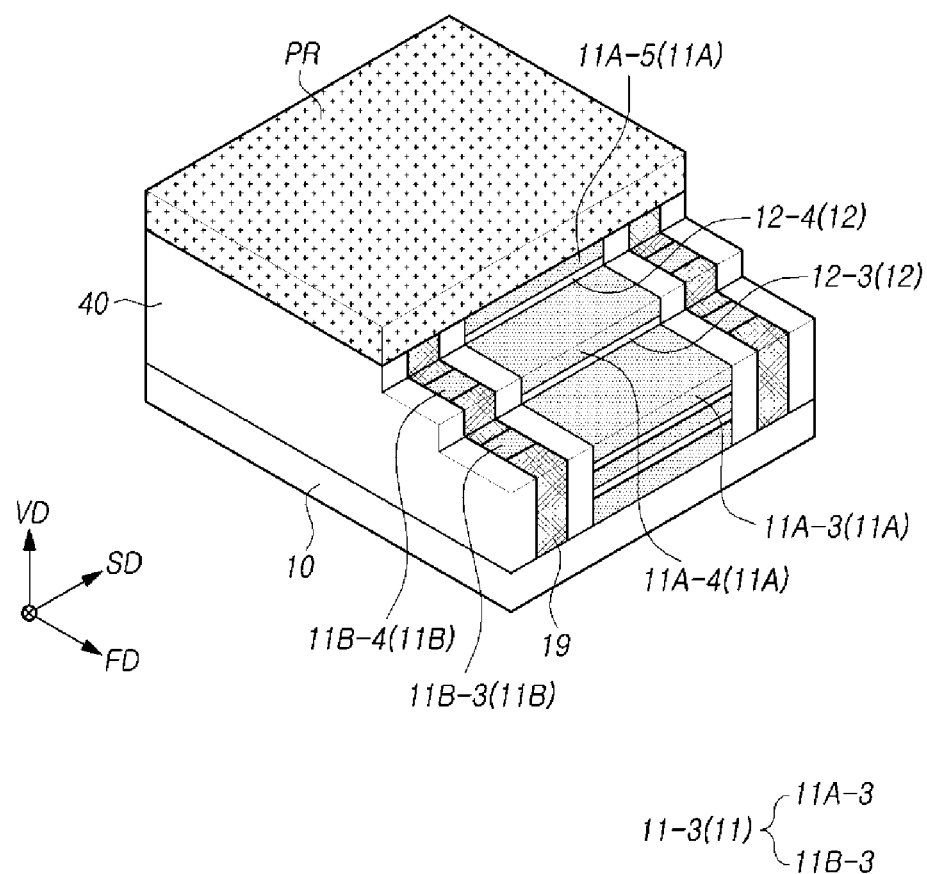
Figure 15F:
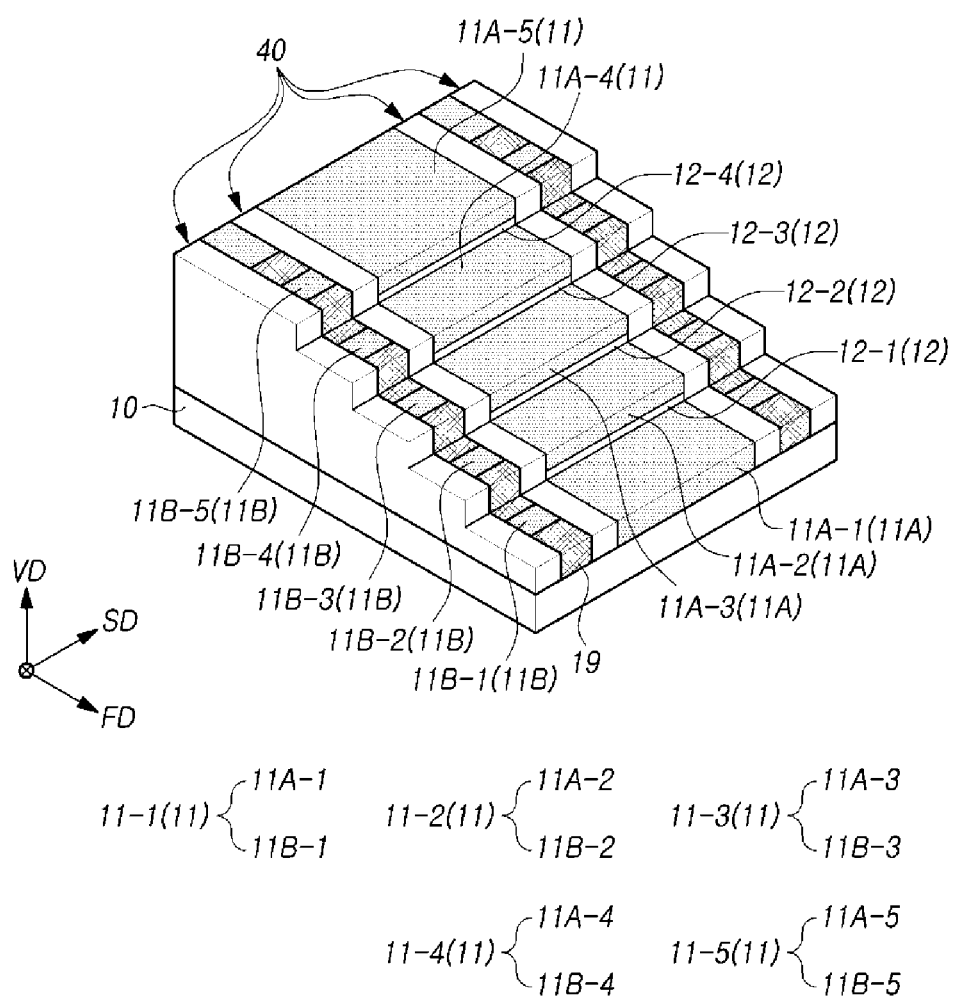
Figure 15G:
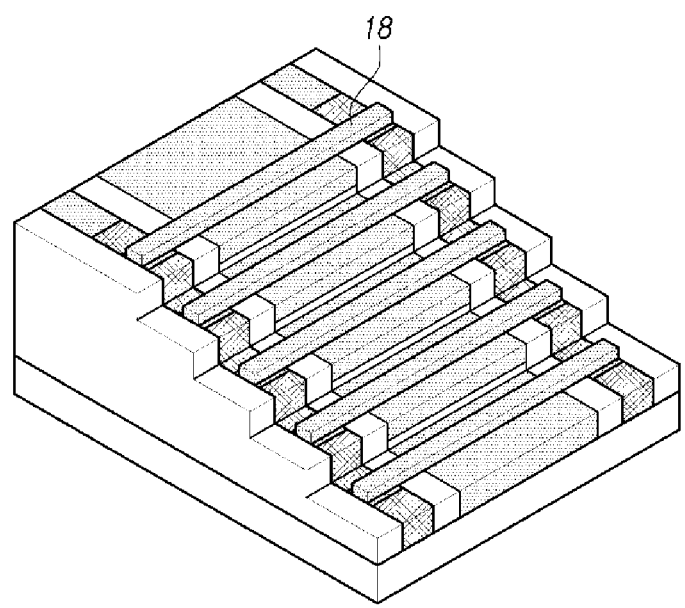
Figure 16A:
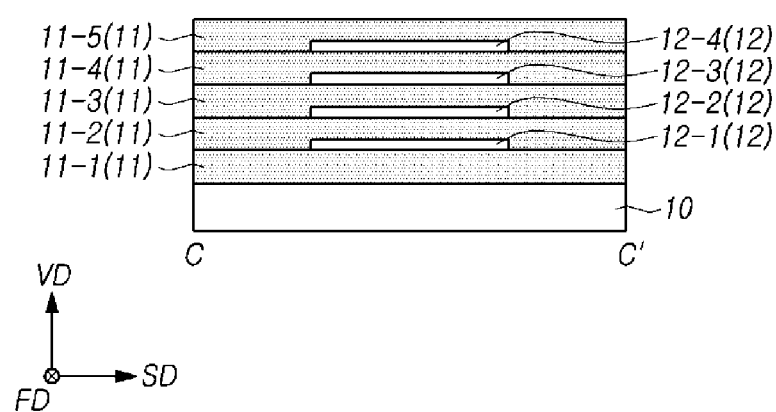
FIGS. 16A to 16C are sectional views taken along lines C-C' of FIGS. 15A to 15C.
Figure 16B:
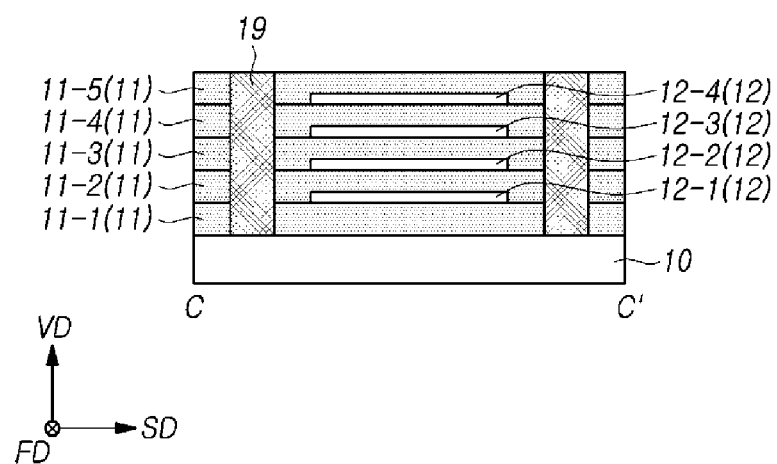
Figure 16C:
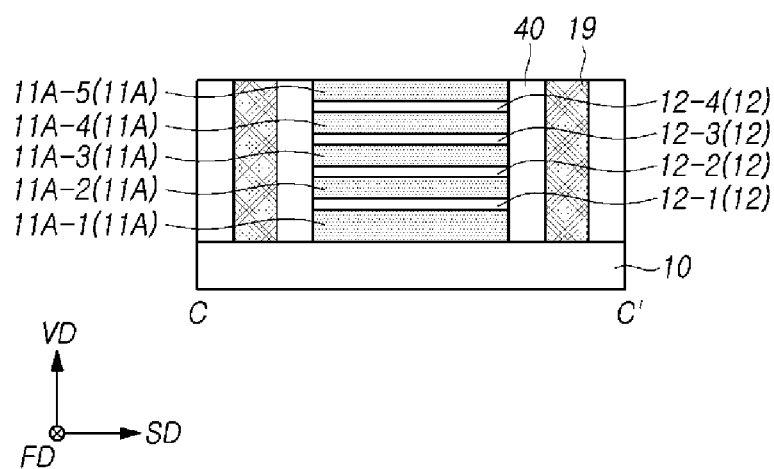

FIG. 14 is a flow chart illustrating a method for manufacturing a three-dimensional memory device in accordance with still another embodiment of the disclosure, FIGS. 15A to 15G are perspective views illustrating, by process steps, a three-dimensional memory device in accordance with still another embodiment of the disclosure, and FIGS. 16A to 16C are sectional views taken along lines C-C' of FIGS. 15A to 15C.

Referring to FIGS. 14 to 16C, a method for manufacturing a three-dimensional memory device in accordance with an embodiment of the disclosure may include a step S1401 of forming a sacrificial layer 11 on a first substrate 10; a step S1402 of forming, on the sacrificial layer 11, an interlayer dielectric layer 12 that covers a portion of the sacrificial layer 11; a step S1403 of stacking a plurality of sacrificial layers 11 and a plurality of interlayer dielectric layers 12 by alternately repeating the step of forming the sacrificial layer 11 and the step of forming the interlayer dielectric layer 12; a step S1404 of forming, in the vicinity of the plurality of interlayer dielectric layers 12, a plurality of supports 19 that pass through the plurality of sacrificial layers 11; a step S1405 of separating, by forming a slit in the sacrificial layers 11, a sacrificial pattern 11A for a row line and a plurality of sacrificial patterns 11B for vias included in each of the sacrificial layers 11; a step S1406 of forming a staircase structure that exposes a portion of each of the sacrificial layers 11; a step S1407 of forming, on the staircase structure, a plurality of sacrificial patterns 18 for coupling lines, which correspond to the sacrificial layers 11, respectively, each coupling a sacrificial pattern 11A for a row line and a sacrificial pattern 11B for a via of a corresponding sacrificial layer 11; and a step S1408 of replacing the sacrificial layers 11 and the sacrificial patterns 18 for coupling lines, with a conductive material.

In detail, referring to FIGS. 15A and 16A, a sacrificial layer 11-1 (11) may be formed on the first substrate 10, and an interlayer dielectric layer 12-1 (12) may be formed on a partial region of the sacrificial layer 11-1.

As the step of forming the sacrificial layer 11 and the step of forming the interlayer dielectric layer 12 are alternately repeated, a plurality of sacrificial layers 11-1 to 11-5 (11) and a plurality of interlayer dielectric layers 12-1 to 12-4 (12) may be stacked. The plurality of interlayer dielectric layers 12-1 to 12-4 (12) may each have a line shape that extends in the first direction FD, and may be disposed to overlap with each other in the vertical direction VD.

The plurality of sacrificial layers 11-1 to 11-5 (11) and the plurality of interlayer dielectric layers 12-1 to 12-4 (12) may be configured by dielectric materials that have different etching selectivities. For example, the plurality of sacrificial layers 11-1 to 11-5 (11) may be configured by nitride, and the plurality of interlayer dielectric layers 12-1 to 12-4 (12) may be configured by oxide.

Referring to FIGS. 15B and 16B, a plurality of supports 19, which pass through the plurality of sacrificial layers 11-1 to 11-5 (11) in the vertical direction VD, may be formed on both sides of the plurality of interlayer dielectric layers 12-1 to 12-4 (12). When viewed from the top, a plurality of supports 19 may be disposed or arranged in a line in the first direction FD, as an extending direction of the plurality of interlayer dielectric layers 12-1 to 12-4 (12), on each of both sides of the interlayer dielectric layers 12-1 to 12-4 (12).

The supports 19 may be configured by a dielectric material that has an etching selectivity different from that of the sacrificial layers 11-1 to 11-5 (11). For example, in the case where the sacrificial layers 11-1 to 11-5 (11) are configured by nitride, the supports 19 may be configured by oxide.

Referring to FIGS. 15C and 16C, slits, which pass through the plurality of sacrificial layers 11-1 to 11-5 (11) in the vertical direction VD and extend in the first direction FD, may be formed on both sides of the supports 19 disposed in a line in the first direction FD. By the slits, each of the plurality of sacrificial layers 11-1 to 11-5 (11) may be divided into a sacrificial pattern 11A for a row line and a plurality of sacrificial patterns 11B for vias. Sacrificial patterns 11A-1 to 11A-5 (11A) for row lines may be disposed alternately with the plurality of interlayer dielectric layers 12-1 to 12-4 (12) in the vertical direction VD, and the sacrificial patterns 11B for vias may be disposed alternately with the plurality of supports 19 in the first direction FD.

A slit dielectric layer 40 may fill in the slits. The slit dielectric layers 40 may be configured by a dielectric material that has an etching selectivity different from that of the plurality of sacrificial layers 11-1 to 11-5 (11). For example, in the case where the plurality of sacrificial layers 11-1 to 11-5 (11) are configured by nitride, the slit dielectric layer 40 may be configured by oxide.

Referring to FIG. 15D, a mask pattern PR, which exposes a part of the top surface of the uppermost sacrificial layer 11-5, may be formed on the uppermost sacrificial layer 11-5.

A pad etching process of etching a part of a structure including the plurality of sacrificial layers 11-1 to 11-5 (11), the plurality of interlayer dielectric layers 12-1 to 12-4 (12), the supports 19 and the slit dielectric layer 40 by using the mask pattern PR as an etch mask may be performed. In the pad etching process, the structure may be etched to a depth at which the sacrificial layer 11-4 is exposed.

Referring to FIG. 15E, a trimming process of reducing the area of the mask pattern PR may be performed. Through the trimming process, an area exposed by the mask pattern PR may be increased.

The trimming process may horizontally move a sidewall of the mask pattern PR by a predetermined distance in the first direction FD. The horizontal movement distance of the sidewall of the mask pattern PR may correspond to a width, in the first direction FD, of one step configuring the staircase structure described above with reference to FIG. 8.

A pad etching process of etching a part of the structure by using the trimmed mask pattern PR as an etch mask may be performed. In the pad etching process, the structure may be etched to a depth at which the sacrificial layer 11-3 is exposed.

In succession, the trimming process and the pad etching process may be alternately and repeatedly performed. As the trimming process and the pad etching process are repeated, as illustrated in FIG. 15F, a staircase structure that exposes end portions of the sacrificial layers 11-1 to 11-5 may be formed.

The mask pattern PR may be configured by a photoresist. The mask pattern PR remaining after the staircase structure is formed may be removed through a strip process.

Referring to FIG. 15G, a plurality of sacrificial patterns 18 for coupling lines may be formed on the staircase structure. The sacrificial patterns 18 for coupling lines may correspond to the sacrificial layers 11-1 to 11-5 (11) (see FIG. 15F), respectively, and may each couple the sacrificial pattern 11A for a row line (see FIG. 15F) and the sacrificial pattern 11B for a via (see FIG. 15F) of a corresponding sacrificial layer 11 (see FIG. 15F). The sacrificial patterns 18 for coupling lines may be directly coupled to the top surfaces of the sacrificial pattern 11A for a row line (see FIG. 15F) and the sacrificial pattern 11B for a via (see FIG. 15F) of a corresponding sacrificial layer 11 (see FIG. 15F).

The sacrificial layers 11-1 to 11-5 (11) (see FIG. 15F) and the sacrificial patterns 18 for coupling lines, which are formed through the above-described processes, may have a shape as illustrated in FIG. 13.

Thereafter, as the sacrificial patterns 11A-1 to 11A-5 for row lines, the sacrificial patterns 11B-1 to 11B-5 for vias and the sacrificial patterns 18 for coupling lines are replaced with a conductive material, the plurality of row lines RL, the plurality of vias VIA and the plurality of coupling lines CL may be formed as illustrated in FIG. 8.

Figure 17:
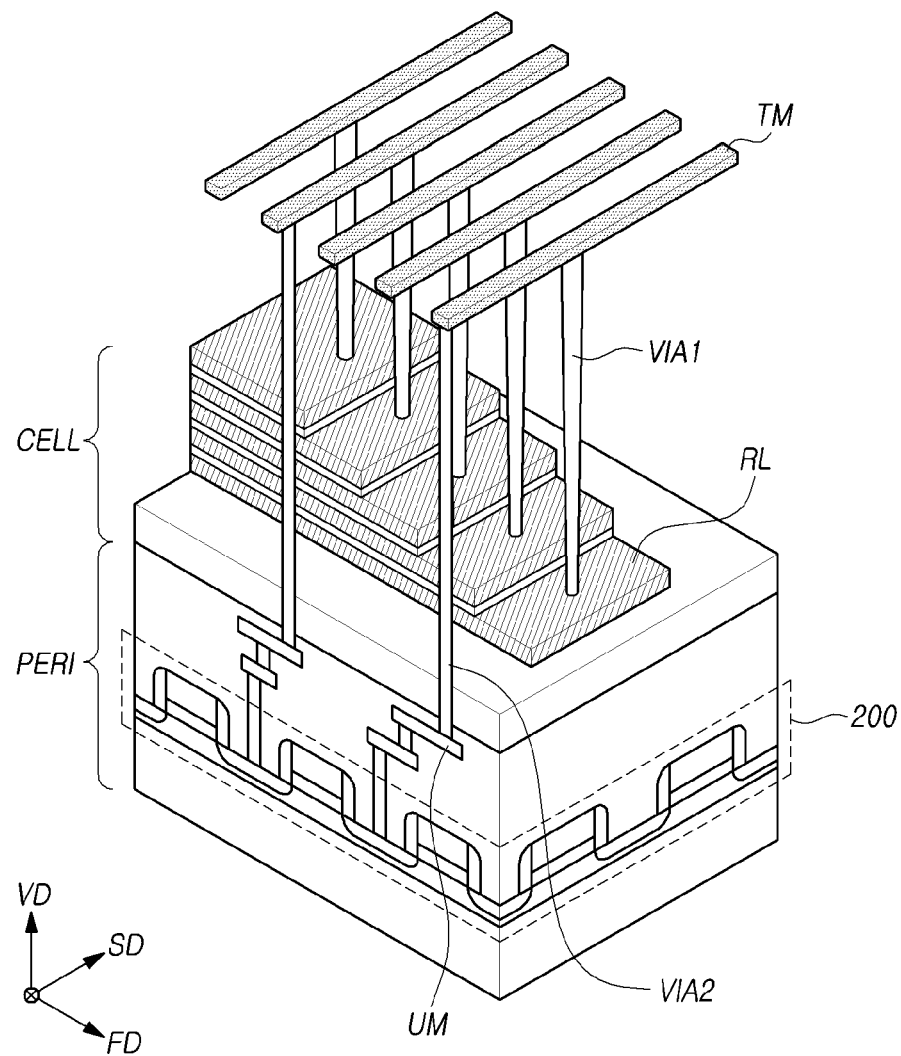
FIG. 17 is a perspective view illustrating a three-dimensional memory device that is different from embodiments of the disclosure.

FIG. 17 is a perspective view illustrating a three-dimensional memory device that is different from embodiments of the disclosure.

Referring to FIG. 17, a row line RL may be coupled to a peripheral circuit 200 through a top wiring line TM. In this case, if the number of row lines RL increases, then the number of top wiring lines TM needed to couple the row lines RL and the peripheral circuit 200 increases, and an area occupied by the top wiring lines TM increases, thereby increasing the size of the memory device.

In addition, since the row line RL is coupled to the peripheral circuit 200 through a first via VIA1, the top wiring line TM, a second via VIA2 and a bottom wiring line UM, a length of an electrical path that couples the row line RL and the peripheral circuit 200 increases, and thus, there is high possibility that a functional error occurs due to an RC delay.

According to embodiments of the disclosure described above, since a top wiring line is not used for coupling the row line RL and the peripheral circuit 200, the number of top wiring lines may be reduced, thereby contributing to the improvement in the degree of integration. Also, a length of an electrical path that couples the row line RL and the peripheral circuit 200 may be shortened, thereby contributing to the reduction in an RC delay.

Referring back to FIG. 17, in order to form the first via VIA1, a deep hole may be etched through a single etching process. In this case, a slope may be induced on the sidewall of the hole due to an etch loading, and thereby, each first via VIA1 may have a size that gradually decreases downward. When a depth of the first via VIA1 is deep, an open failure may occur in which the first via VIA1 is not coupled to the row line RL.

Further, in order to form the first vias VIA1 coupled onto the row lines RL, which have different vertical positions, a plurality of holes having different depths should be formed through an etching process. In the case where the etching is not accurately controlled, a short failure in which one first via VIA1 is coupled to at least two row lines RL, or an open failure in which the first via VIA1 is not coupled to the row line RL, may occur.

According to embodiments of the disclosure, vias may be formed by stacking sacrificial patterns for vias and replacing the stacked sacrificial patterns for vias with a conductive material. Therefore, it is possible to form each via in a uniform size and to contribute to reducing an open failure of a via. Moreover, since the vias are not coupled onto row lines, it is possible to prevent the above-described short failure or open failure.

Figure 18:
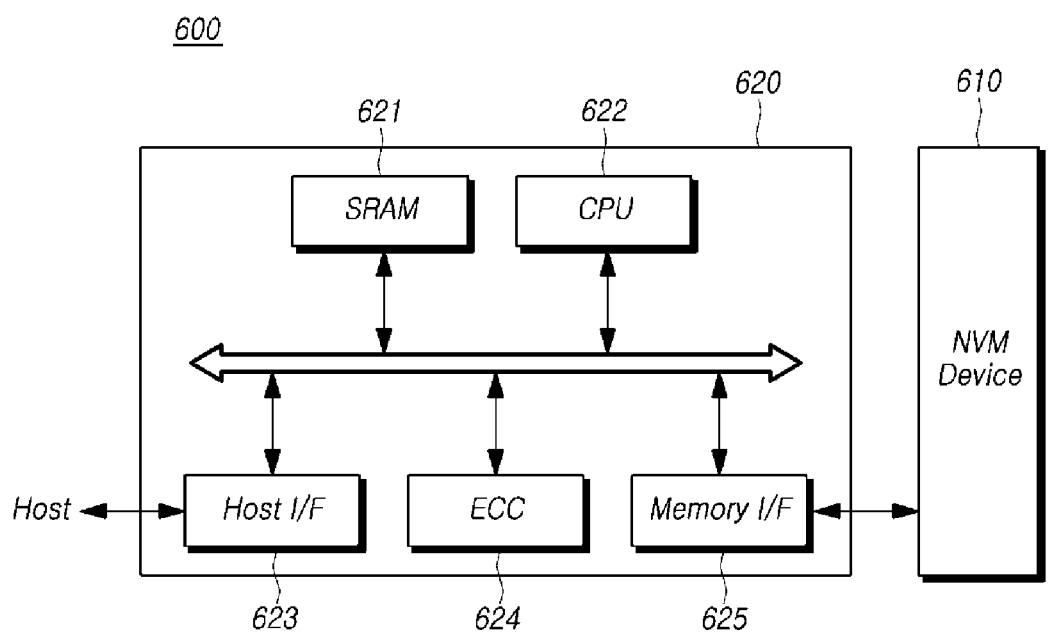
FIG. 18 is a block diagram schematically illustrating a memory system including a three-dimensional memory device in accordance with an embodiment of the disclosure.

FIG. 18 is a block diagram schematically illustrating a memory system including a three-dimensional memory device in accordance with an embodiment of the disclosure.

Referring to FIG. 18, a memory system 600 in accordance with an embodiment may include a nonvolatile memory device (NVM Device) 610 and a memory controller 620.

The nonvolatile memory device (NVM Device) 610 may be constituted by a semiconductor memory device described above and may operate in the manner described above. The memory controller 620 may be configured to control the nonvolatile memory device (NVM Device) 610. By the combination of the nonvolatile memory device (NVM Device) 610 and the memory controller 620, a memory card or a solid state disk (SSD) may be provided. An SRAM 621 is used as a working memory of a processing unit (CPU) 622. A host interface (Host I/F) 623 includes a data exchange protocol of a host, which is coupled with the memory system 600.

An error correction code block (ECC) 624 detects and corrects an error included in data read from the nonvolatile memory device 610.

A memory interface (Memory I/F) 625 interfaces with the nonvolatile memory device 610 of the present embodiment. The processing unit 622 performs general control operations for data exchange of the memory controller 620.

Although not shown in the drawing, it is obvious to a person skilled in the art to which the embodiment pertains that the memory system 600 in accordance with the embodiment may be additionally provided with a ROM which stores code data for interfacing with the host. The nonvolatile memory device (NVM Device) 610 may be provided as a multi-chip package which is constituted by a plurality of flash memory chips.

The memory system 600 in accordance with the embodiment, described above, may be provided as a storage medium of high reliability, which has a low probability of an error to occur. In particular, the nonvolatile memory device of the present embodiment may be included in a memory system such as a solid state disk (SSD) which is being actively studied recently. In this case, the memory controller 620 may be configured to communicate with an exterior (for example, the host) through one of various interface protocols such as a USB (universal serial bus) protocol, an MMC (multimedia card) protocol, a PCI-E (peripheral component interconnection express) protocol, an SATA (serial advanced technology attachment) protocol, a PATA (parallel advanced technology attachment) protocol, an SCSI (small computer system interface) protocol, an ESDI (enhanced small disk interface) protocol and an IDE (Integrated Drive Electronics) protocol.

Figure 19:
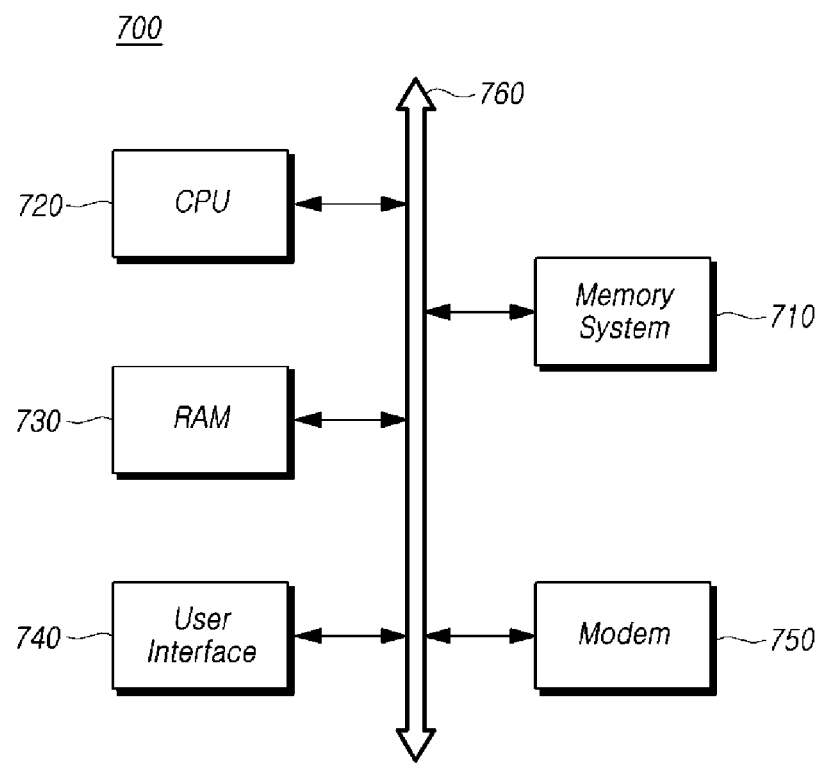
FIG. 19 is a block diagram schematically illustrating a computing system including a three-dimensional memory device in accordance with an embodiment of the disclosure.

FIG. 19 is a block diagram schematically illustrating a computing system including a three-dimensional memory device in accordance with an embodiment of the disclosure.

Referring to FIG. 19, a computing system 700 in accordance with an embodiment may include a memory system 710, a microprocessor (CPU) 720, a RAM 730, a user interface 740 and a modem 750 such as a baseband chipset, which are electrically coupled to a system bus 760. In the case where the computing system 700 in accordance with the embodiment is a mobile device, a battery (not shown) for supplying the operating voltage of the computing system 700 may be additionally provided. Although not shown in the drawing, it is obvious to a person skilled in the art to which the embodiment pertains that the computing system 700 in accordance with the embodiment may be additionally provided with an application chipset, a camera image processor (CIS), a mobile DRAM, and so on. The memory system 710 may configure, for example, an SSD (solid state drive/disk) which uses a nonvolatile memory to store data. Otherwise, the memory system 710 may be provided as a fusion flash memory (for example, an OneNAND flash memory).

Although exemplary embodiments of the disclosure have been described for illustrative purposes, those skilled in the art will appreciate that various modifications, additions and substitutions are possible, without departing from the scope and spirit of the disclosure. Therefore, the embodiments disclosed above and in the accompanying drawings should be considered in a descriptive sense only and not for limiting the technological scope. The technological scope of the disclosure is not limited by the embodiments and the accompanying drawings. The spirit and scope of the disclosure should be interpreted by the appended claims and encompass all equivalents falling within the scope of the appended claims.

What is claimed is:

1. A method for manufacturing a three-dimensional memory device, comprising:
    forming, on a substrate, a sacrificial layer including a plurality of sacrificial patterns for vias and a sacrificial pattern for a row line, which has a projection coupled to a corresponding sacrificial pattern for a via from among the plurality of sacrificial patterns for vias;
    forming an interlayer dielectric layer that covers the sacrificial pattern for a row line and the sacrificial pattern for a via coupled to the sacrificial pattern for a row line and that has a plurality of holes exposing sacrificial patterns for vias, from among the plurality of sacrificial patterns for vias, that are not coupled to the sacrificial pattern for a row line;
    forming a plurality of first conductive patterns in the plurality of holes;
    repeating the forming of the sacrificial layer, the forming of the interlayer dielectric layer and the forming of the plurality of first conductive patterns to stack a plurality of sacrificial layers, a plurality of interlayer dielectric layers and a plurality of first conductive patterns on the substrate; and
    replacing the plurality of sacrificial layers with a conductive material.

2. The method according to claim 1, wherein the plurality of sacrificial layers are configured by a dielectric material that has an etching selectivity with respect to the plurality of interlayer dielectric layers.

3. The method according to claim 1, wherein, in the forming of the sacrificial layer,
    the plurality of sacrificial patterns for vias are formed to be arranged in a first direction as an extending direction of the sacrificial pattern for a row line, and
    the projection of the sacrificial pattern for a row line is formed to be coupled to a sacrificial pattern for a via that is outermost in the first direction from among the plurality of sacrificial patterns for vias.

* * * * *